United States Patent
Koo

(10) Patent No.: US 7,078,878 B2
(45) Date of Patent: Jul. 18, 2006

(54) METHOD FOR DETERMINING A STEADY STATE BATTERY TERMINAL VOLTAGE

(75) Inventor: Jae Seung Koo, Hwaseong (KR)

(73) Assignee: Hyundai Motor Company, Seoul (KR)

( * ) Notice: Subject to any disclaimer, the term of this patent is extended or adjusted under 35 U.S.C. 154(b) by 155 days.

(21) Appl. No.: 10/750,690

(22) Filed: Dec. 31, 2003

(65) Prior Publication Data

US 2005/0030041 A1 Feb. 10, 2005

(30) Foreign Application Priority Data

Aug. 7, 2003 (KR) ............... 10-2003-0054720

(51) Int. Cl.
*H02J 7/00* (2006.01)

(52) U.S. Cl. .......................... 320/132; 324/429
(58) Field of Classification Search ................ 320/132, 320/134, 136, 150–153; 324/429, 430, 431, 324/433
See application file for complete search history.

(56) References Cited

FOREIGN PATENT DOCUMENTS

| JP | 2002-236157 | 8/2002 |
|----|-------------|--------|
| JP | 2003-197275 | 11/2003 |

*Primary Examiner*—Michael Sherry
*Assistant Examiner*—Robert Grant
(74) *Attorney, Agent, or Firm*—Morgan Lewis & Bockius LLP

(57) ABSTRACT

A method for determining a steady state battery terminal voltage is provided. An equivalent charge (or discharge) resistance is determined based on predetermined equivalent charge (or discharge) resistance data, and an effective no load charge (or discharge) voltage is determined based on predetermined effective no load charge (or discharger) voltage data. The steady state battery terminal voltage is calculated based on the calculated equivalent charge (or discharge) resistance and the calculated effective no load charge (or discharge) voltage.

32 Claims, 26 Drawing Sheets

[charge current <1C]

[1C< charge current <5C]

[charge current <1C]

[1C< charge current]

[5C< discharge current]

[5C< discharge current <10C]

Depth of Discharge
[10C< discharge current]

Depth of Discharge
[discharge current <5C]

[5C< discharge current <10C]

[10C< discharge current]

Depth of Discharge
[discharge current <1C]

Depth of Discharge
[1C< discharge current]

METHOD FOR DETERMINING A STEADY STATE BATTERY TERMINAL VOLTAGE

CROSS-REFERENCE TO RELATED APPLICATIONS

This application claims priority of Korean Application No. 10-2003-0054720, filed on Aug. 7, 2003, the disclosure of which is incorporated fully herein by reference.

FIELD OF THE INVENTION

The present invention relates to a method for calculating a steady state battery terminal voltage.

BACKGROUND OF THE INVENTION

A hybrid electric vehicle can improve the energy efficiency of an engine of a vehicle and decrease the amount of exhaust emissions of the engine. The improvements in energy efficiency for hybrid electric vehicles is due in part to the regeneration of electric energy from vehicle kinetic energy while the vehicle is being braked.

A battery is an important part of a hybrid electric vehicle. The battery supplies power and stores remaining power. Unfortunately, the available power of the battery varies according to operating temperature, a state of charge (SOC), aging, or the like, thus making it is difficult to employ the battery in a hybrid electric vehicle.

The terminal voltage of the battery increases as the battery charges, and it decreases as the battery discharges. In addition, the terminal voltage of the battery also changes according to charging/discharging load, so it is quite difficult to model battery terminal voltage characteristics.

A battery cell terminal voltage $U_{cell}$ of a battery cell in FIG. 1 can be obtained according to the following equation 1:

$$U_{cell} = U_{ocv} - \frac{1}{C}\int I_{avg}dt - U_c - \quad \text{[Equation 1]}$$
$$U_d(I_{avg}) - (R_a(T_{BAT}, \ldots) + R_c) \times I_{avg},$$

where $U_{ocv}$ is a no-load voltage (or a battery open-circuit voltage), $U_c$ is a voltage variation due to load history, C is a capacitance, $I_{avg}$ is an average current, $U_d$ is a voltage drop due to dipoles (chemical activity) on the reactive surface, $R_a$ is an electrolyte resistance, $R_c$ is a conductor resistance, and $T_{BAT}$ is a battery temperature. The electrolyte resistance $R_a$ changes according to an SOC, a battery temperature, and aging of the battery, and the conductor resistance $R_c$ changes according to the aging of the battery.

In FIG. 2, an electric circuit that is equivalent to the battery cell of FIG. 1 is shown. Based on this equivalent circuit, a terminal voltage $V_t$ can be obtained according to the following equation 2:

$$V_t = V_{oc} - I_t \times (R_h + R_d \times (1 - e^{-t/R_d C_p})), \quad \text{[Equation 2]}$$

where $V_{oc}$ is an effective no load voltage, $I_t$ is a charge (or discharge) current, $R_h$ is an instantaneous resistance, $R_d$ is a delayed resistance, and $C_p$ is a parallel capacitance. The conductor resistance $R_c$ contributed by the positive and negative terminals and a current collector can be expressed as the instantaneous resistance $R_h$. The electrolyte resistance is determined by $C_p$.

As can be observed from Equation 2, a precise calculation of the battery terminal voltage $V_t$ as a function of time using the battery equivalent model shown in FIG. 2, is dependent upon knowledge of the capacitor value $C_p$. A precise capacitor value, however, is difficult to calculate because it changes according to load conditions and operating conditions.

Accordingly, what is needed is a method for determining a steady state battery terminal voltage under load and operating conditions.

SUMMARY OF THE INVENTION

The disclosed embodiments of the present invention provide a method for calculating a steady state battery terminal voltage.

In some embodiments of the present invention, the method for determining a steady state battery terminal voltage comprises: determining an equivalent charge resistance data at predetermined battery temperatures and predetermined states of charge (SOCs) for predetermined charge current ranges; determining effective no load charge voltage data at the predetermined battery temperatures and the predetermined SOCs for the predetermined charge current ranges on the basis of the equivalent charge resistance data; calculating an equivalent charge resistance at a current charge current, a current battery temperature, and a current SOC, based on the equivalent charge resistance data; calculating an effective no load charge voltage at the current charge current, the current battery temperature, and the current SOC, based on the effective no load charge voltage data; and calculating the steady state battery terminal voltage at the current charge current, the current battery temperature, and the current SOC, based on the calculated equivalent charge resistance and the calculated effective no load charge voltage.

In some embodiments, the step of determining an equivalent charge resistance data comprises: detecting first battery terminal voltages at each of the predetermined SOCs while charging a battery at each of the predetermined battery temperatures with first constant charge currents belonging to each of the predetermined charge current ranges; detecting second battery terminal voltages at each of the predetermined SOCs while charging the battery at each of the predetermined battery temperatures with second constant charge currents belonging to each of the predetermined charge current ranges; and determining the equivalent charge resistance data at the predetermined battery temperatures and the predetermined SOCs for each of the predetermined charge current ranges, based on the first constant charge currents, the first battery terminal voltages, the second constant charge currents, and the second battery terminal voltages.

In some embodiments, the equivalent charge resistance data $R_{cha\_e\_data}$ is calculated by the following equation:

$$R_{cha\_e\_data} = \left(\frac{V_2 - V_1}{I_2 - I_1}\right)@SOC,$$

where $I_1$ is the first constant charge current, $I_2$ is the second constant charge current, $V_1$ is the first battery terminal voltage, and $V_2$ is the second battery terminal voltage.

In some embodiments, the effective no load charge voltage data $V_{cha\_oc\_data}$ is calculated by one of the following equations:

$$V_{cha\_oc\_data} = V_2 + I_2 \times R_{cha\_e\_data} @ SOC;$$

and $$V_{cha\_oc\_data} = V_1 + I_1 \times R_{cha\_e\_data} @ SOC.$$

In some embodiments, an equivalent charge resistance, the equivalent charge resistance at the current charge current, the current battery temperature, and the current SOC are calculated based on the equivalent charge resistance data for the predetermined charge current range to which the current charge current belongs. In other embodiments, the equivalent charge resistance is calculated through interpolation.

In some embodiments, an effective no load charge voltage, the effective no load charge voltage at the current charge current, the current battery temperature, and the current SOC are calculated based on the effective no load charge voltage data for the predetermined charge current range to which the current charge current belongs. In other embodiments, the effective no load charge voltage is calculated through interpolation.

In some embodiments, the steady state battery terminal voltage $V_{cha\_t}$, the steady state battery terminal voltage at the current charge current, the battery temperature, and the current SOC are calculated by the following equation:

$$V_{cha\_t} = V_{cha\_oc} - I_{cha\_t} \times R_{cha\_e}$$

where $V_{cha\_oc}$ is the effective no load charge voltage, $I_{cha\_t}$ is the current charge current, and $R_{cha\_e}$ is the equivalent charge resistance.

In some embodiments, the predetermined charge current ranges include a range where a charge current is less than 1C, a range where the charge current is between 1C and 5C, and a range where the charge current is greater than 5C.

In some embodiments of the present invention, the method for determining a steady state battery terminal voltage, comprises: calculating an equivalent charge resistance at a current charge current, a current battery temperature, and a current state of charge (SOC), based on predetermined equivalent charge resistance data that is determined at predetermined battery temperatures and predetermined SOCs for predetermined charge current ranges; calculating an effective no load charge voltage at the current charge current, the current battery temperature, and the current SOC, based on predetermined effective no load charge voltage data that is determined at the predetermined battery temperatures and the predetermined SOCs for the predetermined charge current ranges; and calculating the steady state battery terminal voltage at the current charge current, the current battery temperature, and the current SOC, based on the calculated equivalent charge resistance and the calculated effective no load charge voltage.

In some embodiments, the equivalent charge resistance is calculated based on the current battery temperature, the current SOC, and the equivalent charge resistance data for the predetermined current range to which the current charge current belongs. In other embodiments, the equivalent charge resistance is calculated through interpolation.

In some embodiments, the effective no load charge voltage is calculated based on the current battery temperature, the current SOC, and the equivalent no load charge voltage data for the predetermined charge current range to which the current charge current belongs. In other embodiments, the effective no load charge voltage is calculated through interpolation.

In some embodiments, the steady state battery terminal voltage is calculated by the following equation:

$$V_{cha\_t} = V_{cha\_oc} - I_{cha\_t} \times R_{cha\_e}$$

where $V_{cha\_oc}$ is the effective no load charge voltage, $I_{cha\_t}$ is the current charge current, and $R_{cha\_e}$ is the equivalent charge resistance.

In some embodiments of the present invention, the method for determining a steady state battery terminal voltage, comprises: determining equivalent discharge resistance data at predetermined battery temperatures and predetermined depths of discharge (DODs) for predetermined discharge current ranges; determining effective no load discharge voltage data at the predetermined battery temperatures and the predetermined DODs for the predetermined discharge current ranges on the basis of the equivalent discharge resistance data; calculating an equivalent discharge resistance at a current discharge current, a current battery temperature, and a current DOD, based on the equivalent discharge resistance data; calculating an effective no load discharge voltage at the current discharge current, the current battery temperature, and the current DOD, based on the effective no load discharge voltage data; and calculating the steady state battery terminal voltage at the current discharge current, the current battery temperature, and the current DOD, based on the calculated equivalent discharge resistance and the calculated effective no load discharge voltage.

In some embodiments, the determining of an equivalent discharge resistance data comprises: detecting first battery terminal voltages at each of the predetermined DODs while discharging a battery at each of the predetermined battery temperatures with first constant discharge currents belonging to each of the predetermined discharge current ranges; detecting second battery terminal voltages at each of the predetermined DODs while discharging the battery at each of the predetermined battery temperatures with second constant discharge currents belonging to each of the predetermined discharge current ranges; and determining the equivalent discharge resistance data at the predetermined battery temperatures and the predetermined DODs for each of the predetermined discharge current ranges, based on the first constant discharge currents, the first battery terminal voltages, the second constant discharge currents, and the second battery terminal voltages.

In some embodiments, the equivalent discharge resistance data $R_{dch\_e\_data}$ is calculated by the following equation:

$$R_{dch\_e\_data} = \left(\frac{V_2 - V_1}{I_2 - I_1}\right) @ DOD,$$

where $I_1$ is the first constant discharge current, $I_2$ is the second constant discharge current, $V_1$ is the first battery terminal voltage, and $V_2$ is the second battery terminal voltage.

In some embodiments, the effective no load discharge voltage data $V_{dch\_oc\_data}$ is calculated by one of the following equations:

$$V_{dch\_oc\_data} = V_2 + I_2 \times R_{dch\_e\_data} @ DOD;$$

and $$V_{dch\_oc\_data} = V_1 + I_1 \times R_{dch\_e\_data} @ DOD.$$

In some embodiments, the equivalent discharge resistance at the current discharge current, the current battery temperature, and the current DOD are calculated based on the equivalent discharge resistance data for the predetermined discharge current range to which the current discharge current belongs. In other embodiments, the equivalent discharge resistance is calculated through interpolation.

In some embodiments, the effective no load discharge voltage at the current discharge current, the current battery temperature, and the current DOD are calculated based on the effective no load discharge voltage data for the predetermined discharge current range to which the current discharge current belongs. In other embodiments, the effective no load discharge voltage is calculated through interpolation.

In some embodiments, the steady state battery terminal voltage at the current discharge current, the battery temperature, and the current DOD is calculated by the following equation:

$$V_{dch\_t} = V_{dch\_oc} - I_{dch\_t} \times R_{dch\_e}$$

where $V_{dch\_oc}$ is the effective no load discharge voltage, $I_{dch\_t}$ is the current discharge current, and $R_{dch\_e}$ is the equivalent discharge resistance.

In some embodiments, The predetermined discharge current ranges include a range where a discharge current is less than 1C, a range where the discharge current is between 1C and 5C, and a range where the discharge current is greater than 5C.

In some embodiments of the present invention, the method for determining a steady state battery terminal voltage comprises: calculating an equivalent discharge resistance at a current discharge current, a current battery temperature, and a current depth of discharge (DOD), based on predetermined equivalent discharge resistance data that are determined at predetermined battery temperatures and predetermined DODs for predetermined discharge current ranges; calculating an effective no load discharge voltage at the current discharge current, the current battery temperature, and the current DOD, based on predetermined effective no load discharge voltage data that are determined at the predetermined battery temperatures and the predetermined DODs for the predetermined discharge current ranges; and calculating the steady state battery terminal voltage at the current discharge current, the current battery temperature, and the current DOD, based on the calculated equivalent discharge resistance and the calculated effective no load discharge voltage.

In some embodiments, the equivalent discharge resistance is calculated based on the current battery temperature, the current DOD, and the equivalent discharge resistance data for the predetermined current range to which the current discharge current belongs. In other embodiments, the equivalent discharge resistance is calculated through interpolation.

In some embodiments, the effective no load discharge voltage is calculated based on the current battery temperature, the current DOD, and the equivalent no load discharge voltage data for the predetermined discharge current range to which the current discharge current belongs. In other embodiments, the effective no load discharge voltage is calculated through interpolation.

In some embodiments, the steady state battery terminal voltage is calculated by the following equation:

$$V_{dch\_t} = V_{dch\_oc} - I_{dch\_t} \times R_{dch\_e}$$

where $V_{dch\_oc}$ is the effective no load discharge voltage, $I_{dch\_t}$ is the current discharge current, and $R_{dch\_e}$ is the equivalent discharge resistance.

BRIEF DESCRIPTION OF THE DRAWINGS

The accompanying drawings, which are incorporated in and constitute a part of the specification, illustrate an embodiment of the invention, and, together with the description, serve to explain the principles of the invention, where.

DETAILED DESCRIPTION OF THE PREFERRED EMBODIMENTS

Hereinafter, an embodiment of the present invention will be described in detail with reference to the accompanying drawings.

Figure 1:
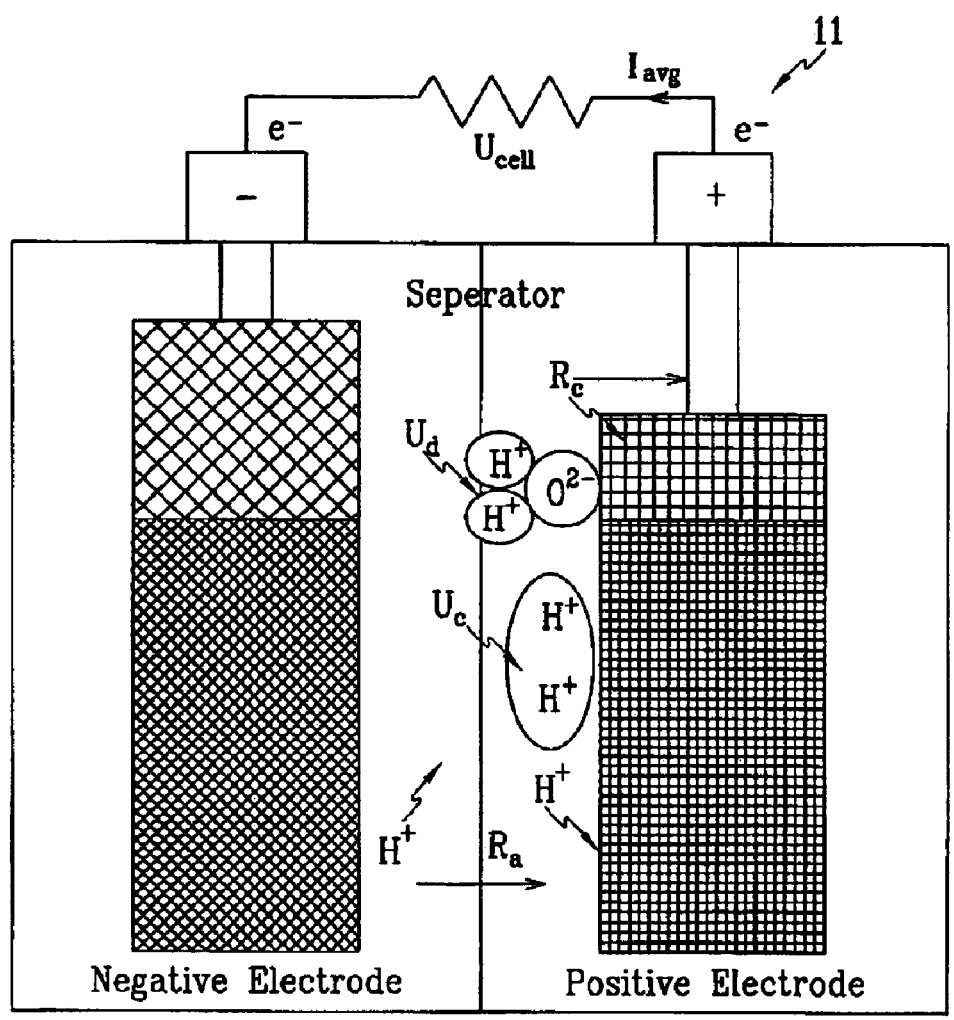
FIG. 1 is a circuit diagram of a battery.
Figure 2:
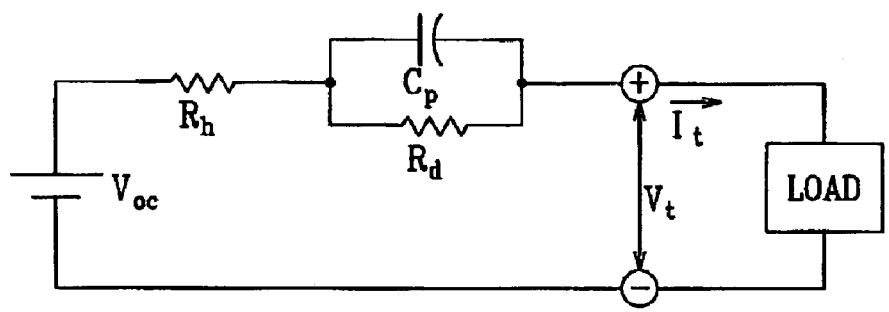
FIG. 2 is a circuit diagram of an equivalent electric circuit for the battery of FIG. 1.
Figure 3:
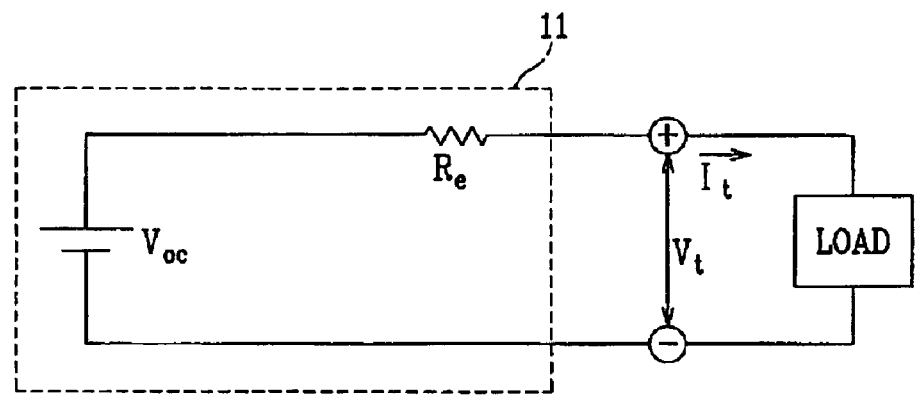
FIG. 3 is a circuit diagram of an equivalent electric circuit of the battery of FIG. 1 in a steady state.

A method for calculating a steady state battery terminal voltage according to an embodiment of the present invention uses a steady state battery equivalent circuit as shown in FIG. 3. The steady state battery terminal voltage $V_t$ can be calculated by the following equation 3.

$$V_t = V_{oc} - I_t \times R_e \qquad \text{[Equation 3]}$$

where $V_{oc}$ is an effective no load charge voltage (or an effective no load discharge voltage), It is a charge current (or a discharge current), and $R_e$ is an equivalent charge resistance (or an equivalent discharge resistance).

Equation 3 can be expressed as follows when the battery is charged:

$$V_{cha\_t} = V_{cha\_oc} - I_{cha\_t} \times R_{cha\_e}$$

where $V_{cha\_t}$ is the steady state battery terminal voltage, $V_{cha\_oc}$ is the effective no load charge voltage, $I_{cha\_t}$ is the current charge current, and $R_{cha\_e}$ is the equivalent charge resistance.

Similarly, the equation 3 can be expressed as follows when the battery is discharged:

$$V_{dch\_t} = V_{dch\_oc} - I_{dch\_t} \times R_{dch\_e}$$

where $V_{dch\_t}$ is the steady state battery terminal voltage, $V_{dch\_oc}$ is the effective no load discharge voltage, $I_{dch\_t}$ is the current discharge current, and $R_{dch\_e}$ is the equivalent discharge resistance.

A resistance of the battery is composed of a conductor resistance due to a positive terminal, a negative terminal, and a current collector, and an electrochemical resistance due to a chemical reaction according to a state of charge (SOC) or a depth of discharge (DOD) and an electrolyte. The electrochemical resistance has a specific value according to the SOC (or DOD) and a reaction temperature (e.g., a battery temperature).

In the method for calculating the steady state battery terminal voltage according to an embodiment of the present invention, battery terminal voltages are detected at predetermined SOCs while charging (or discharging) the battery with different constant currents at predetermined battery temperatures. Then, the steady state equivalent charge resistance (or the steady state equivalent discharge resistance) are calculated based on the constant current value and the terminal voltage.

Further, in the method for calculating the steady state battery terminal voltage according to an embodiment of the present invention, an effective no load charge voltage (or an effective no load discharge voltage) is calculated on the basis of the equivalent charge resistance (or the equivalent discharge current) and a theoretical voltage-current equation.

In the method for calculating the steady state battery terminal voltage according an embodiment of the present invention, the steady state battery terminal voltage is calculated using equivalent charge resistance data (or equivalent discharge resistance) including equivalent charge resistances (or equivalent discharge resistances) that are determined by the above-stated method, and effective no load charge voltage data (or effective no load discharge voltage data) including effective no load charge voltages (or effective no load discharge voltages) that are determined by the above-stated method.

Figure 4:
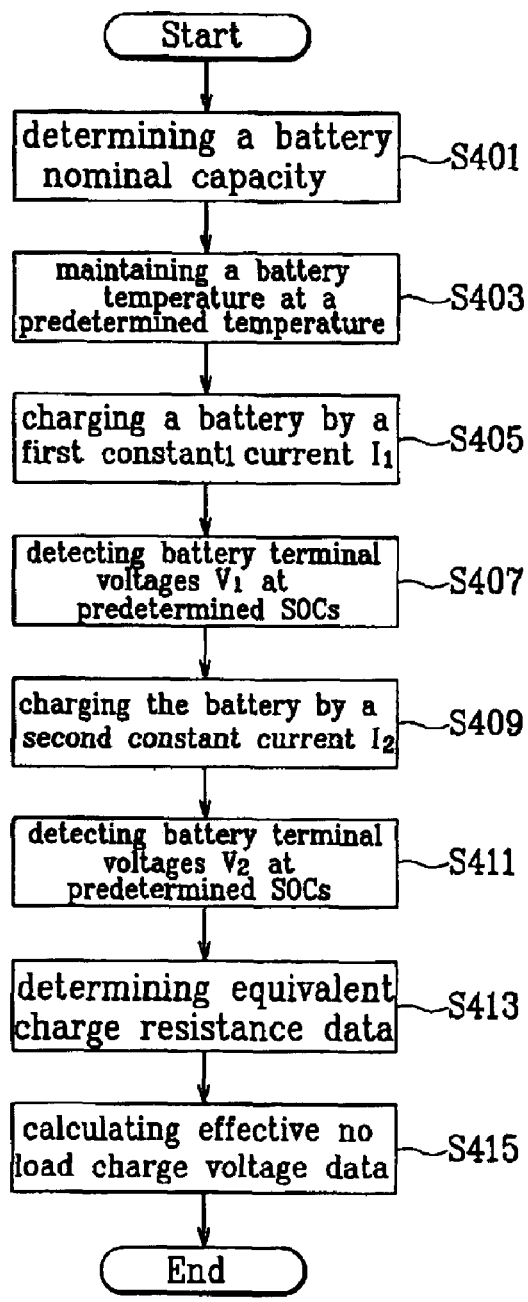
FIG. 4 is a flowchart of a method of determining equivalent charge resistance data and effective no load charge voltage data in the method for determining a steady state battery terminal voltage according to the embodiment of the present invention.

Referring to FIG. 4, a process for determining the equivalent charge resistance data and the effective no load charge voltage will be explained.

In step S401, a battery nominal capacity AH is determined through a nominal capacity test of the battery 11.

A battery temperature is maintained at a predetermined temperature (step S403). Battery characteristics change according to the battery temperature, so it is preferable that the equivalent charge resistance data and the effective no load charge voltage data are determined for at least two battery temperatures. In some embodiments of the present invention, the predetermined battery temperature includes 0° C., 25° C., and 40° C. The predetermined battery temperature can be changed according to the type of a battery used. In some embodiments, the predetermined battery temperature is selected to minimize errors by a non-linearity of characteristics of electrochemical reactions of the battery according to battery temperature.

Furthermore, the equivalent charge resistance changes according to a level of a charge current, so it is preferable that the equivalent charge resistance data is determined for at least two predetermined charge current ranges. In some embodiments, the predetermined charge current ranges include three ranges. For example, the predetermined charge current ranges can include a range where the charge current is less than 1C, a range where the charge current is between 1C and 5C, and a range where the charge current is greater than 5C. However, in the case when the battery temperature is 0° C., the predetermined charge current ranges include a range where the charge current is less than 1C and a range where the charge current is equal to or greater than 1C.

The predetermined charge current range can be changed according to specific battery characteristics. In some embodiments, the charge current ranges are determined to minimize errors by a nonlinearity of the electrochemical reaction of the battery. The current value 1C indicates an amount of a current that charges or discharges to or from the nominal capacity of the battery in one hour.

In step S405, in a state that the battery temperature is maintained at the predetermined temperature, the battery 11 is charged by a first constant current $I_1$ that belongs to the predetermined charge current range. While the battery 11 is being charged by the first constant current, first battery terminal voltages $V_1$ are detected at predetermined states of charge (SOCs), in step S407. For example, the battery terminal voltage is detected when the SOC is 10%, 20%, 30%, 40%, 50%, 60%, 70%, 80%, and 90%.

In step S409, while the battery temperature is being maintained at the predetermined temperature, the battery is charged by a second constant current $I_2$ that belongs to the predetermined charge current range. Then, in step S411, while the battery 11 is being charged by the second constant current, second battery terminal voltages are detected at predetermined SOCs.

Then, in step S413, the equivalent charge resistance data is determined based on the first battery terminal voltages and the second battery terminal voltages. The equivalent charge resistance data $R_{cha\_e\_data}$ includes equivalent charge resistances that are calculated for each of the predetermined SOCs, and they can be determined by the following equation 4:

$$R_{cha\_e\_data} = \left(\frac{V_2 - V_1}{I_2 - I_1}\right) @ SOC, \qquad \text{[Equation 4]}$$

where "@SOC" means that the equivalent charge resistance is calculated at each of the SOC levels.

Then, in step S415, the effective no load charge voltage data is calculated based on the determined equivalent charge resistance data. The effective no load charge voltage data $V_{cha\_oc\_data}$ includes the effective no load charge voltages that are calculated at each of the SOC levels, and they can be calculated by the following equation 5:

$$V_{cha\_oc\_data} = V_2 + I_2 \times R_{cha\_e\_data} @ SOC, \qquad \text{[Equation 5]}$$

or $$V_{cha\_oc\_data} = V_1 + I_1 \times R_{cha\_e\_data} @ SOC,$$

where "@SOC" means that the effective no load charge voltages are calculated at each of the SOC levels.

If the steps S405 to S415 are repeatedly performed using constant currents belonging to each of the charge current ranges while the battery temperature is being maintained at the predetermined temperature, the equivalent charge resistance data and the effective no load charge voltage data for the predetermined battery temperature are calculated.

Further, if the steps S403 to S415 are repeatedly performed for each of the predetermined battery temperatures, the equivalent charge resistance data and the effective no load charge voltage data are determined for each of the predetermined battery temperatures.

FIGS. 8 to 15 show the equivalent charge resistance data and the effective no load charge voltage data for a specific battery, i.e., Panasonic EV Energy® Ni-MH 6.5AH.

Figure 8:
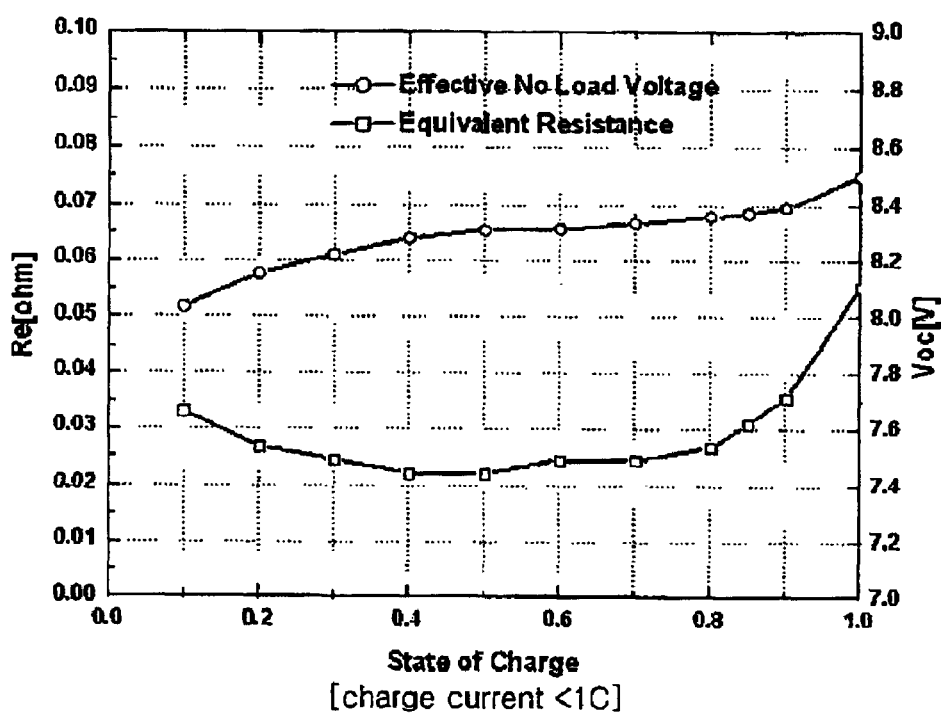
FIGS. 8 to 15 are two-dimensional graphs showing the equivalent charge resistance data and the effective no load charge voltage for various charge currents.
Figure 9:
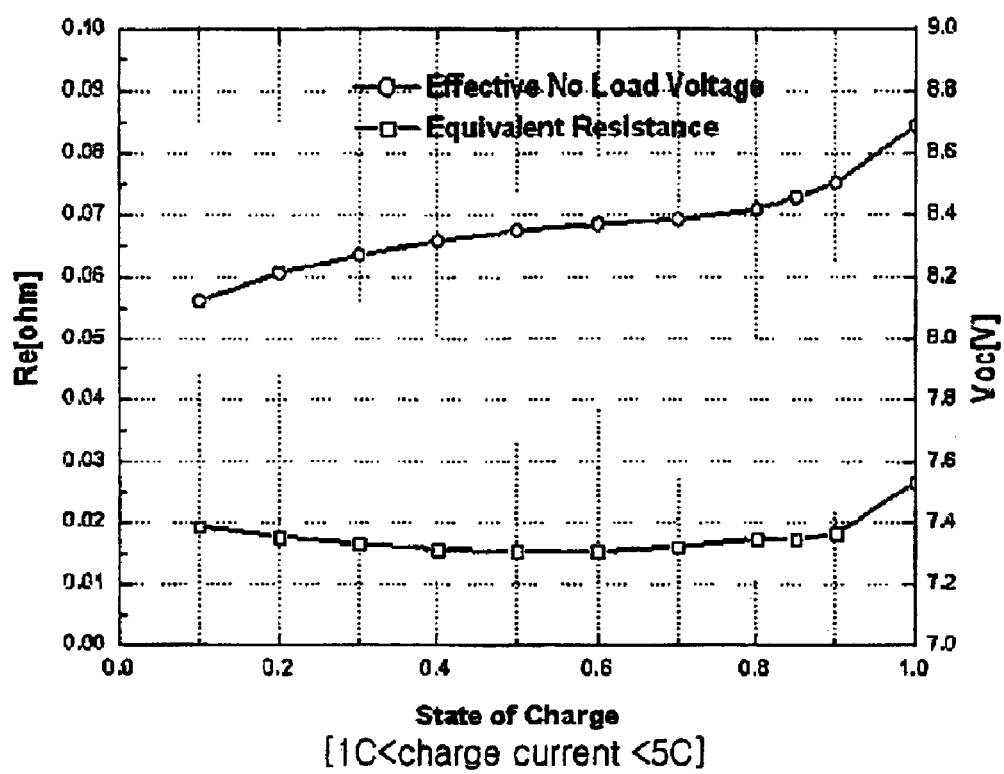
Figure 10:
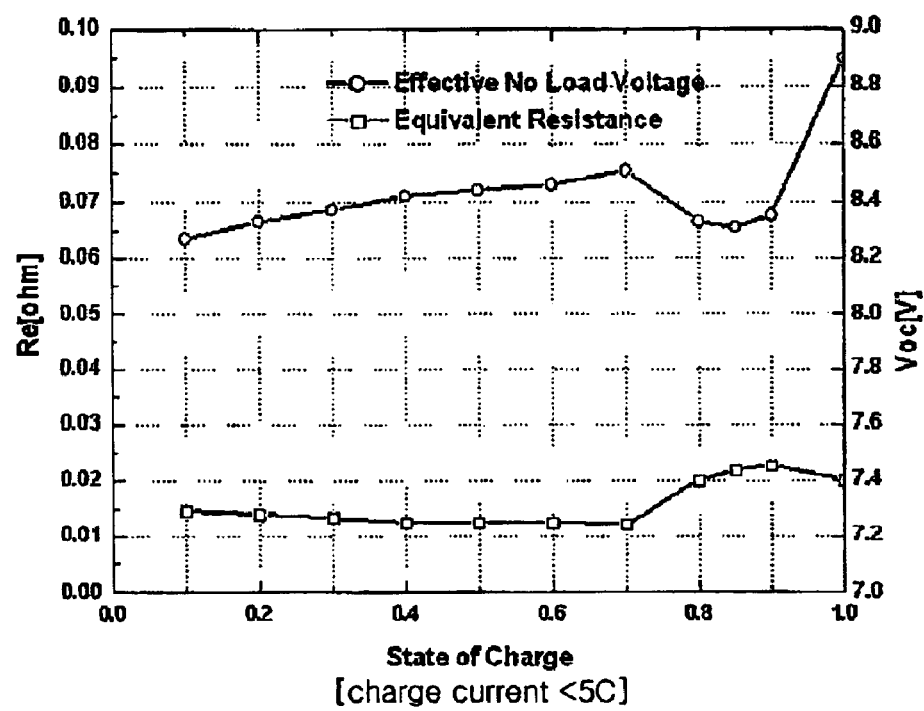
Figure 11:
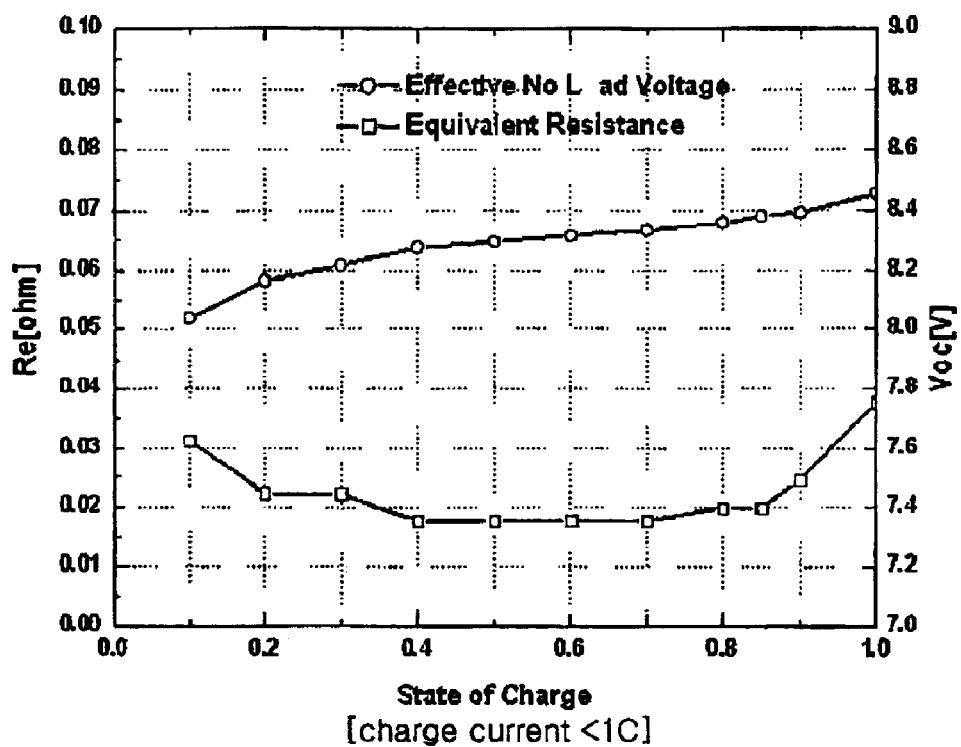
Figure 12:
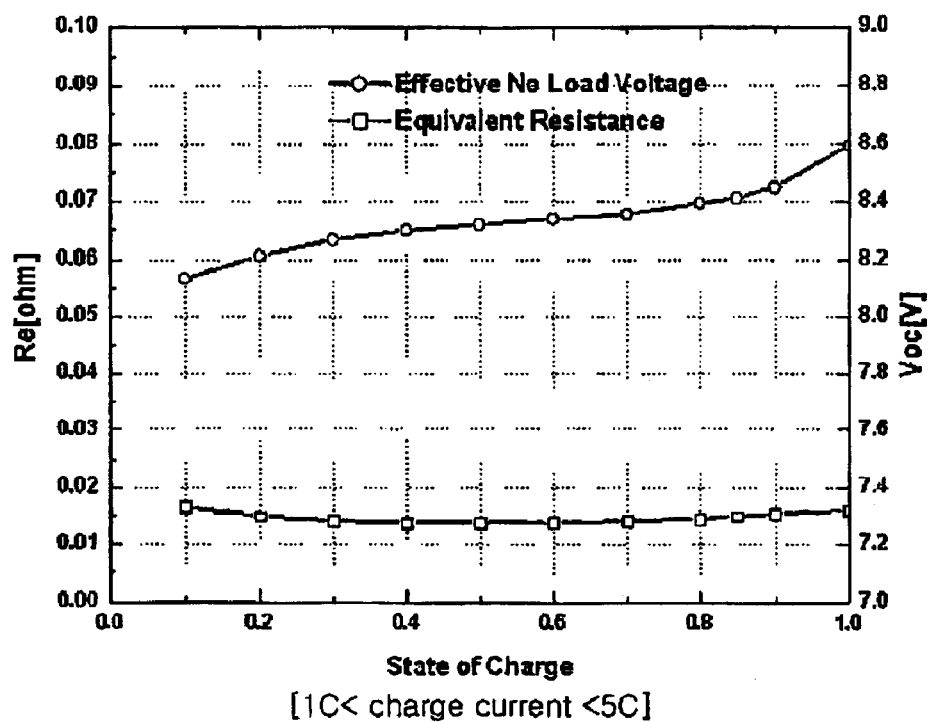
Figure 13:
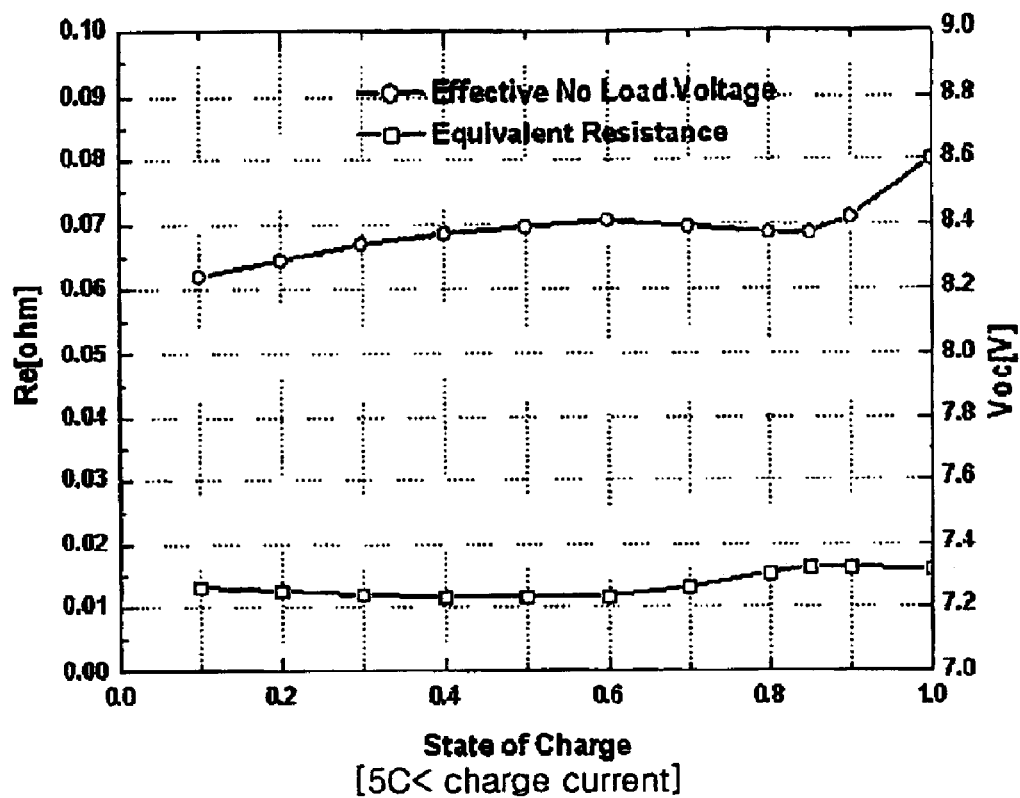
Figure 14:
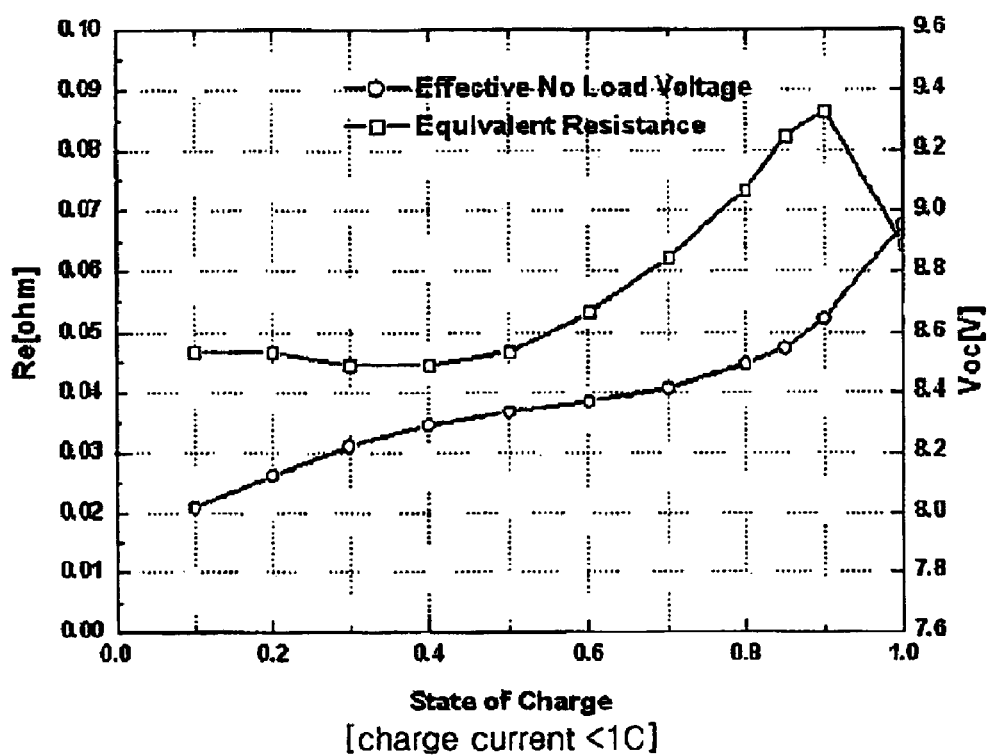
Figure 15:
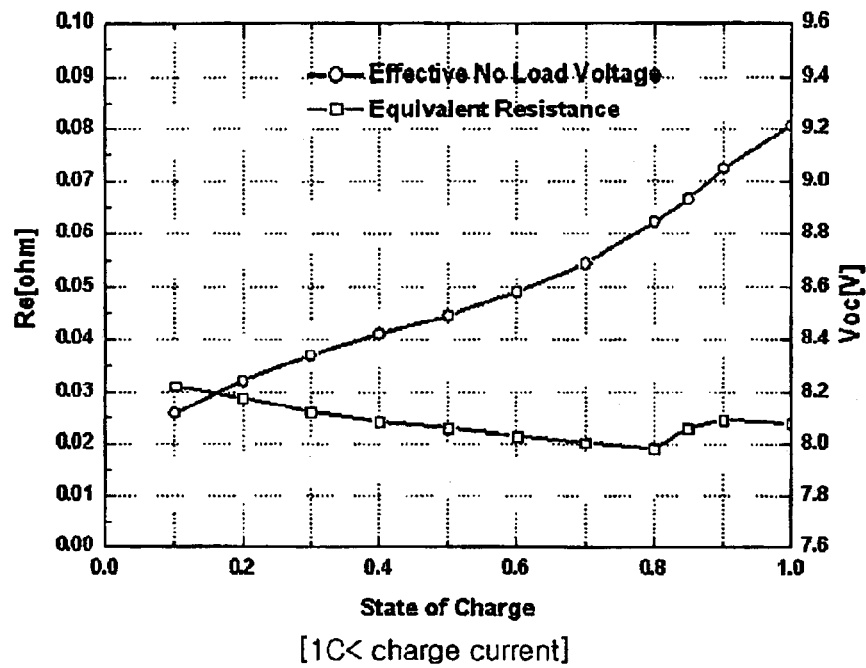

The equivalent charge resistance data and the effective no load charge voltage data for the predetermined battery temperature of 25° C. are shown in FIGS. 8 to 10, the equivalent charge resistance data and the effective no load charge voltage data for the predetermined battery temperature of 40° C. are shown in FIGS. 11 to 13, and the equivalent charge resistance data and the effective no load charge voltage data for the predetermined battery temperature of 0° C. are shown in FIGS. 14 and 15.

In FIG. 8, the equivalent charge resistances and the effective no load voltages at each of the predetermined SOC levels when the predetermined battery temperature is 25° C. and the charge current is less than 1C (e.g., each of the first and second constant currents is less than 1C) are shown.

In FIG. 9, the equivalent charge resistances and the effective no load voltages at each of the predetermined SOC levels when the predetermined battery temperature is 25° C. and the charge current is between 1C and 5C (e.g., each of the first and second constant currents is between 1C and 5C) are shown.

In FIG. 10, the equivalent charge resistances and the effective no load voltages at each of the predetermined SOC levels when the predetermined battery temperature is 25° C. and the charge current is greater than 5C (e.g., each of the first and second constant currents is greater than 5C) are shown.

In FIG. 11, the equivalent charge resistances and the effective no load voltages at each of the predetermined SOC levels when the predetermined battery temperature is 40° C. and the charge current is less than 1C (e.g., each of the first and second constant currents is less than 1C) are shown.

In FIG. 12, the equivalent charge resistances and the effective no load voltages at each of the predetermined SOC levels when the predetermined battery temperature is 40° C. and the charge current is between 1C and 5C (e.g., each of the first and second constant currents is between 1C and 5C) are shown.

In FIG. 13, the equivalent charge resistances and the effective no load voltages at each of the predetermined SOC levels when the predetermined battery temperature is 40° C. and the charge current is greater than 5C (e.g., each of the first and second constant currents is greater than 5C) are shown.

In FIG. 14, the equivalent charge resistances and the effective no load voltages at each of the predetermined SOC levels when the predetermined battery temperature is 0° C. and the charge current is less than 1C (e.g., each of the first and second constant currents is less than 1C) are shown.

In FIG. 15, the equivalent charge resistances and the effective no load voltages at each of the predetermined SOC levels when the predetermined battery temperature is 0° C. and the charge current is greater than 1C (e.g., each of the first and second constant currents is greater than 1C) are shown.

As shown in FIGS. 8 to 15, the equivalent charge resistance and the effective no load charge voltage changes according to the battery temperature, the SOC, and the charge current.

As shown in the drawings, the equivalent charge resistance generally increases with an increase of the SOC. The effective no load charge voltage is calculated by the above-stated equation 5.

Figure 5:
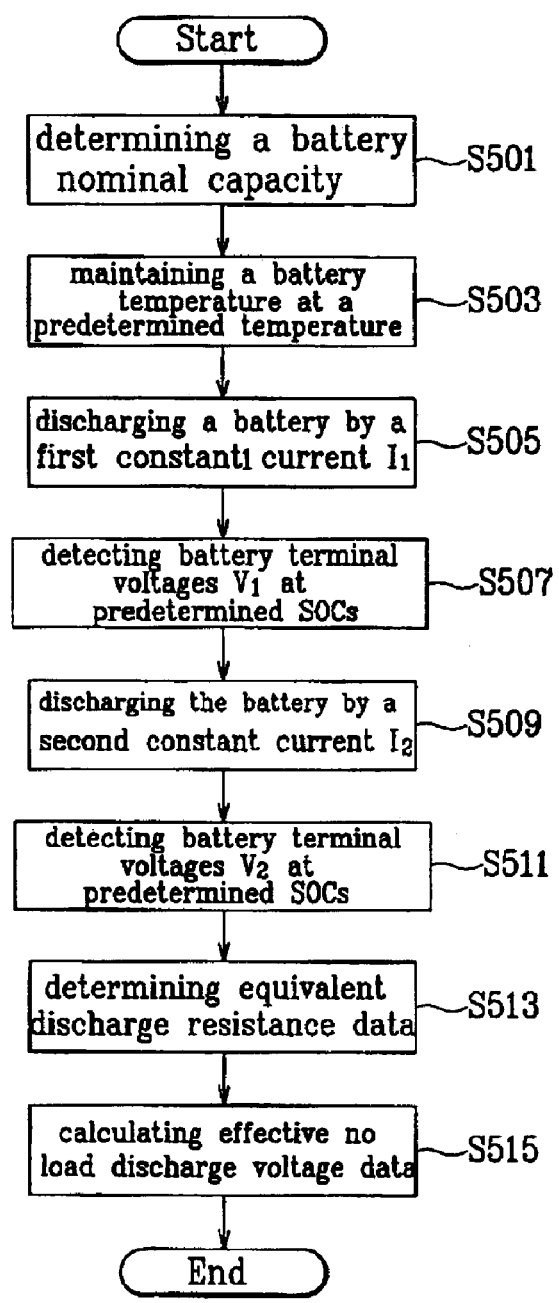
FIG. 5 is a flowchart of a method for determining equivalent discharge resistance data and effective no load discharge voltage data in the method for determining a steady state battery terminal voltage according to the embodiment of the present invention.

Referring to FIG. 5, a process for determining the equivalent discharge resistance data and the effective no load charge voltage will be explained.

At first, in step S501, a battery nominal capacity AH is determined through a nominal capacity test for the battery 11.

A battery temperature is maintained at a predetermined temperature (step S503).

Similar with the charge of the battery, it is preferable that the equivalent discharge resistance data and the effective no load discharge voltage data are determined at predetermined battery temperatures and for predetermined discharge current ranges.

In this embodiment, the predetermined battery temperatures include 0° C., 25° C., and 40° C. The predetermined battery temperature can be changed according to type of battery.

It some embodiments, the predetermined battery temperature is selected to minimize errors by a non-linearity of characteristics of electrochemical reactions of the battery according to a battery temperature.

Furthermore, the equivalent discharge resistance changes according to a level of a discharge current, so in some embodiments the equivalent discharge resistance data is determined for at least two predetermined discharge current ranges.

In this embodiment, the predetermined discharge current ranges include three ranges. That is, the predetermined discharge current ranges include a range where the discharge current is less than 1C, a range where the discharge current is between 1C and 5C, and a range where the discharge current is greater than 5C. However, in the case when the battery temperature is 0° C., the predetermined discharge current ranges include a range where the discharge current is less than 1C and a range where the discharge current is equal to or greater than 1C.

It is preferable that the discharge current ranges are determined to minimize errors by a nonlinearity of the electrochemical reaction of the battery.

In step S505, in a state that the battery temperature is maintained at the predetermined temperature, the battery 11 is discharged by a first constant current $I_1$, that belongs to the predetermined discharge current range.

While the battery 11 is being discharged by the first constant current, first battery terminal voltages are detected at predetermined degrees of discharge (DODs), in step S507. The DOD (%) can be calculated by "100−SOC". For example, the battery terminal voltage is detected at each of 10%, 20%, 30%, 40%, 50%, 60%, 70%, 80%, and 90%.

In step S509, while the battery temperature is being maintained at the predetermined temperature, the battery is discharged by a second constant current $I_2$ that belongs to the predetermined discharge current range.

Then, in step S511, while the battery 11 is being discharged by the second constant current, second battery terminal voltages are detected at predetermined DODs.

Then, in step S513, the equivalent discharge resistance data is determined based on the first battery terminal voltages and the second battery terminal voltages.

The equivalent discharge resistance data $R_{dch\_e\_data}$ includes equivalent discharge resistances that are calculated for each of the predetermined DODs, and they can be determined the following equation 6:

$$R_{dch\_e\_data} = \left(\frac{V_2 - V_1}{I_2 - I_1}\right)@DOD, \quad [\text{Equation 6}]$$

where "@DOD" means that the equivalent discharge resistance is calculated at each of the DOD levels.

Then, in step S515, the effective no load discharge voltage data is calculated based on the determined equivalent discharge resistance data.

The effective no load discharge voltage data $V_{dch\_oc\_data}$ includes the effective no load discharge voltages that are calculated at each of the DOD levels, and they can be calculated by the following equation 7:

$$V_{dch\_oc\_data} = V_2 + I_2 \times R_{dch\_e\_data}@DOD, \quad [\text{Equation 7}]$$

or $$V_{dch\_oc\_data} = V_1 + I_1 \times R_{dch\_e\_data}@DOD,$$

where "@DOD" means that the effective no load discharge voltages are calculated at each of the DOD levels.

If the steps S505 to S515 are repeatedly performed using constant currents belonging to each of the discharge current ranges while the battery temperature is being maintained at the predetermined temperature, the equivalent discharge resistance data and the effective no load discharge voltage data for the predetermined battery temperature are calculated.

Further, if the steps S503 to S515 are repeatedly performed for each of the predetermined battery temperatures, the equivalent discharge resistance data and the effective no load discharge voltage data are determined for each of the predetermined battery temperatures.

FIGS. 16 to 23 show the equivalent discharge resistance data and the effective no load discharge voltage data for a specific battery, i.e., Panasonic EV Energy® Ni-MH 6.5AH.

Figure 16:
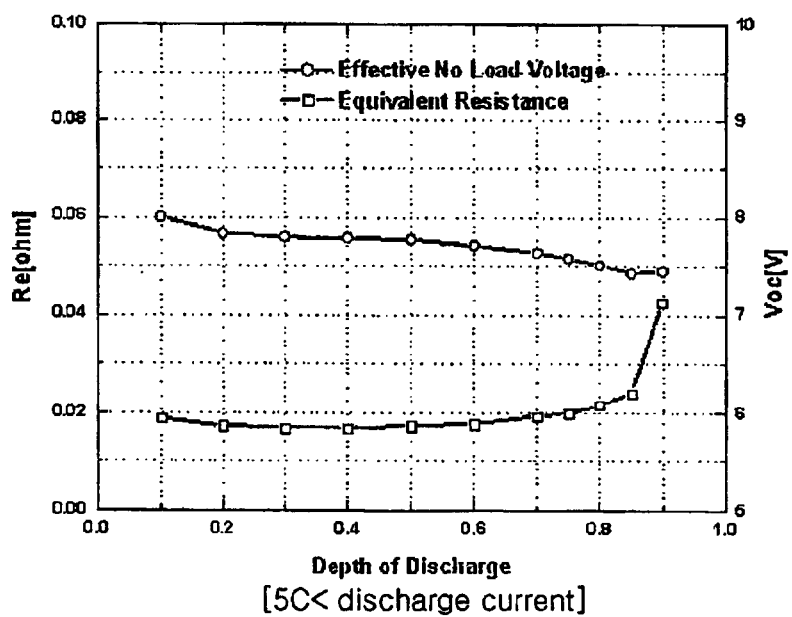
FIGS. 16 to 23 are two-dimensional graphs showing the equivalent discharge resistance data and the effective no load discharge voltage for various discharge currents.
Figure 17:
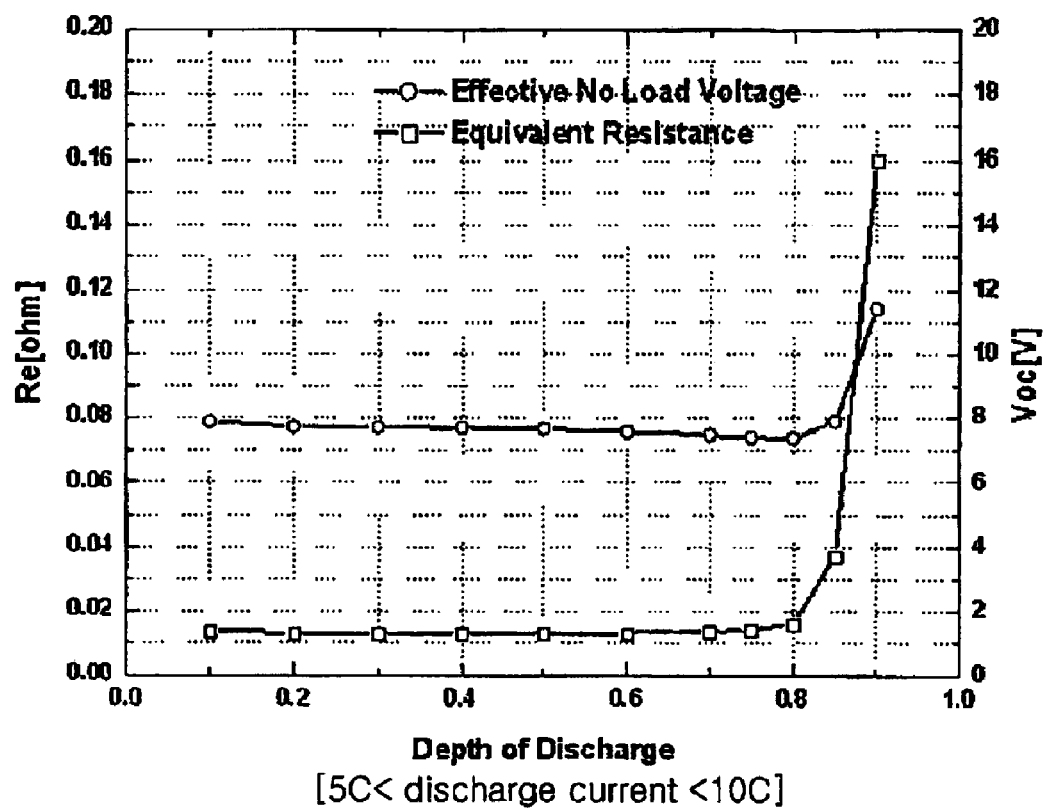
Figure 18:
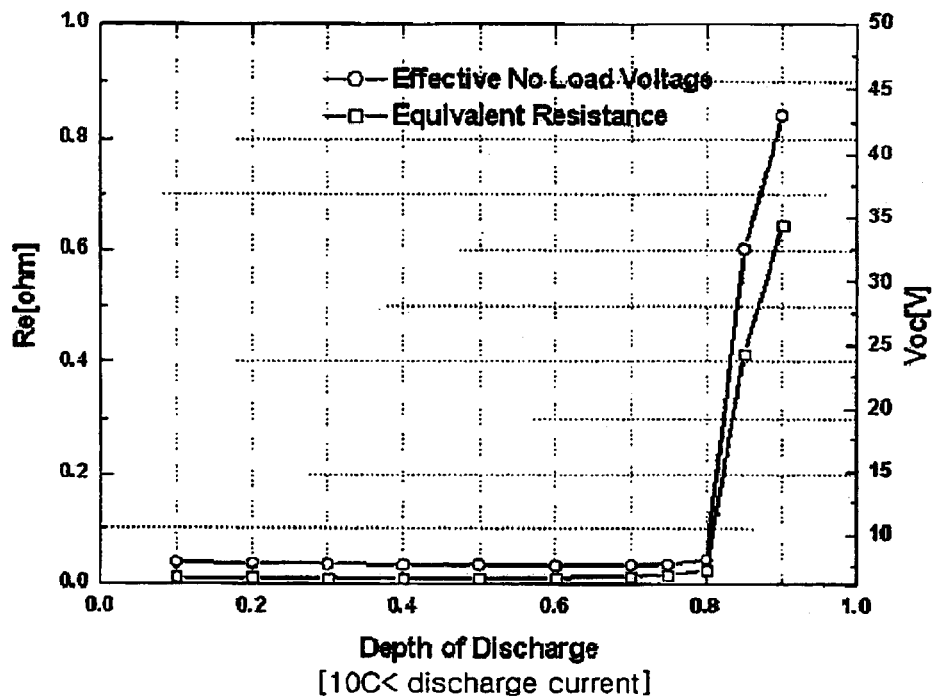
Figure 19:
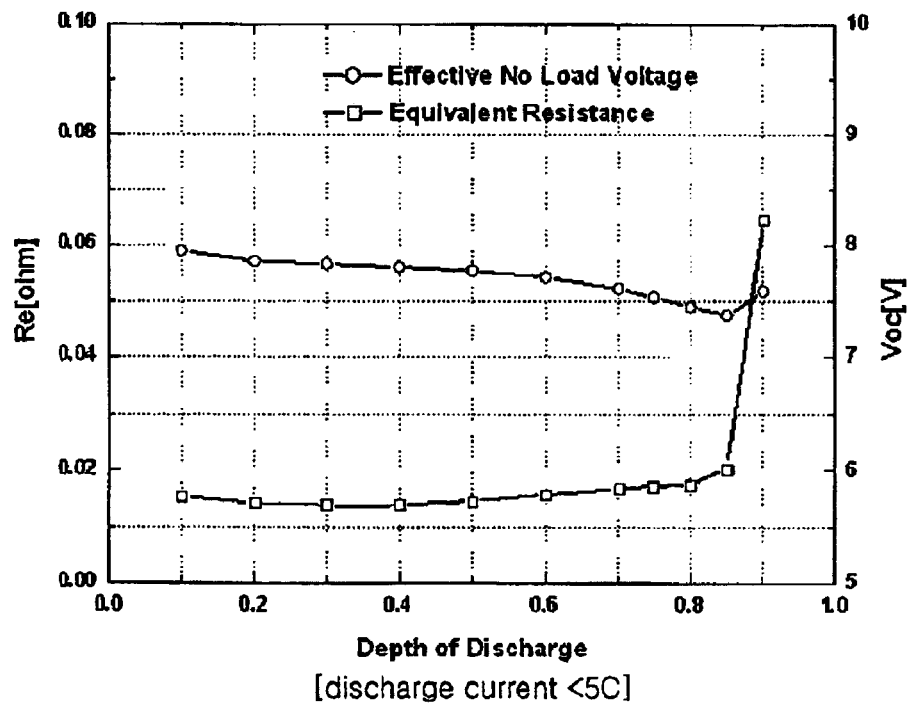
Figure 20:
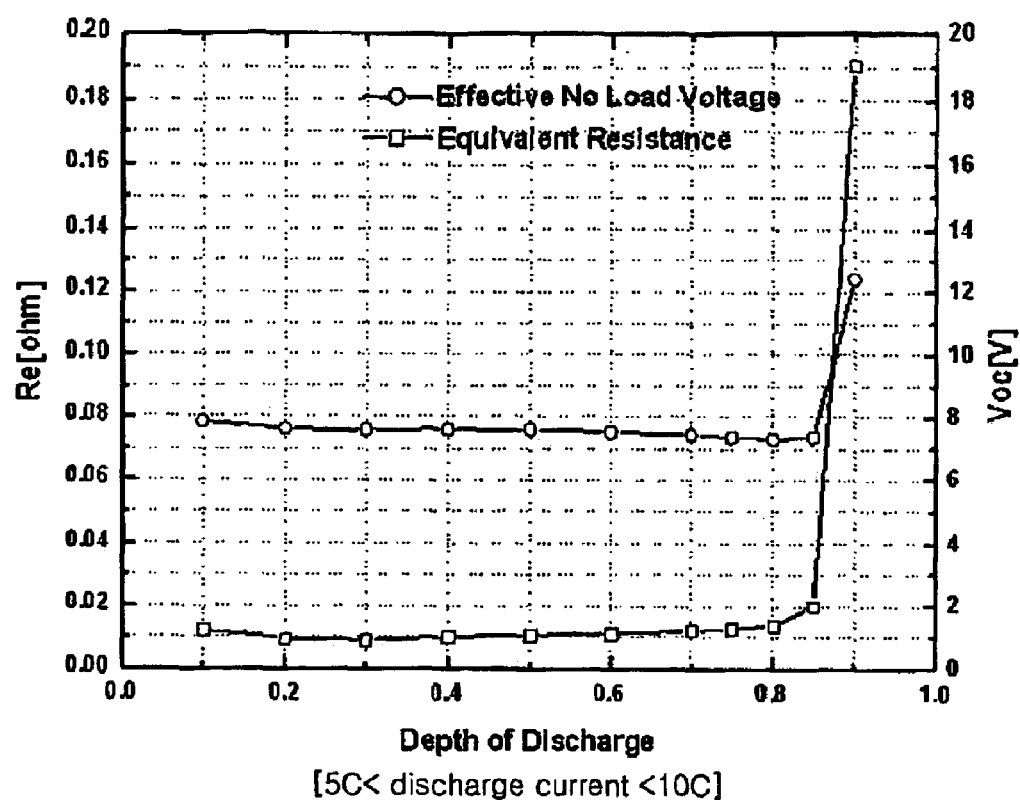
Figure 21:
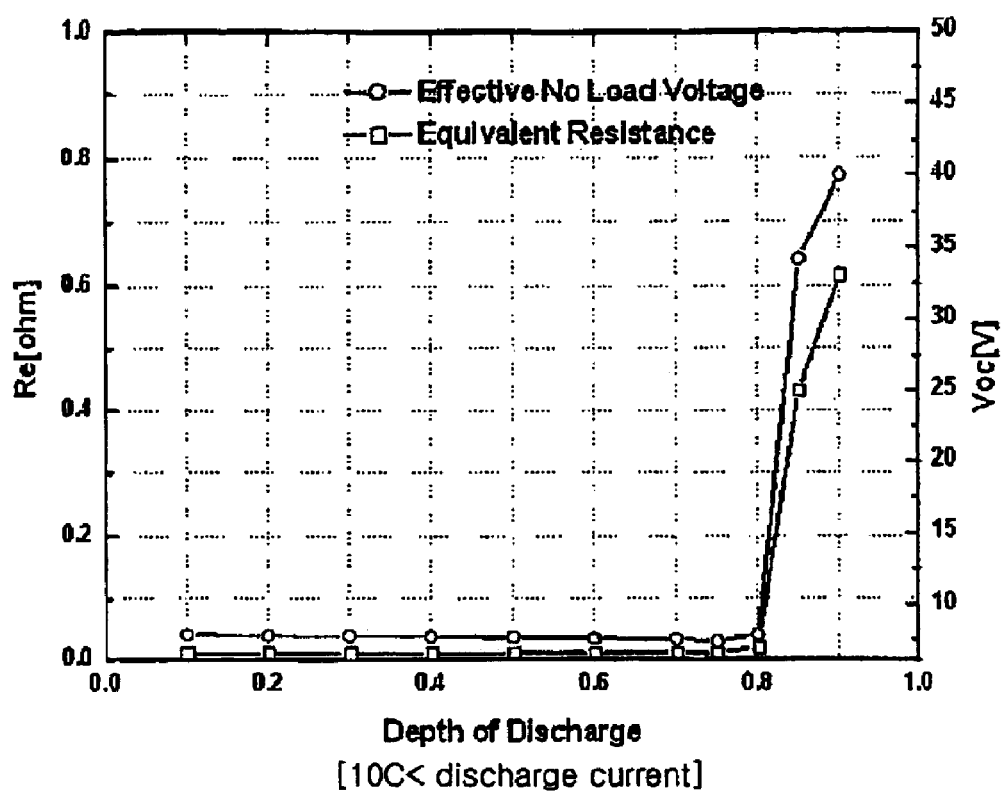
Figure 22:
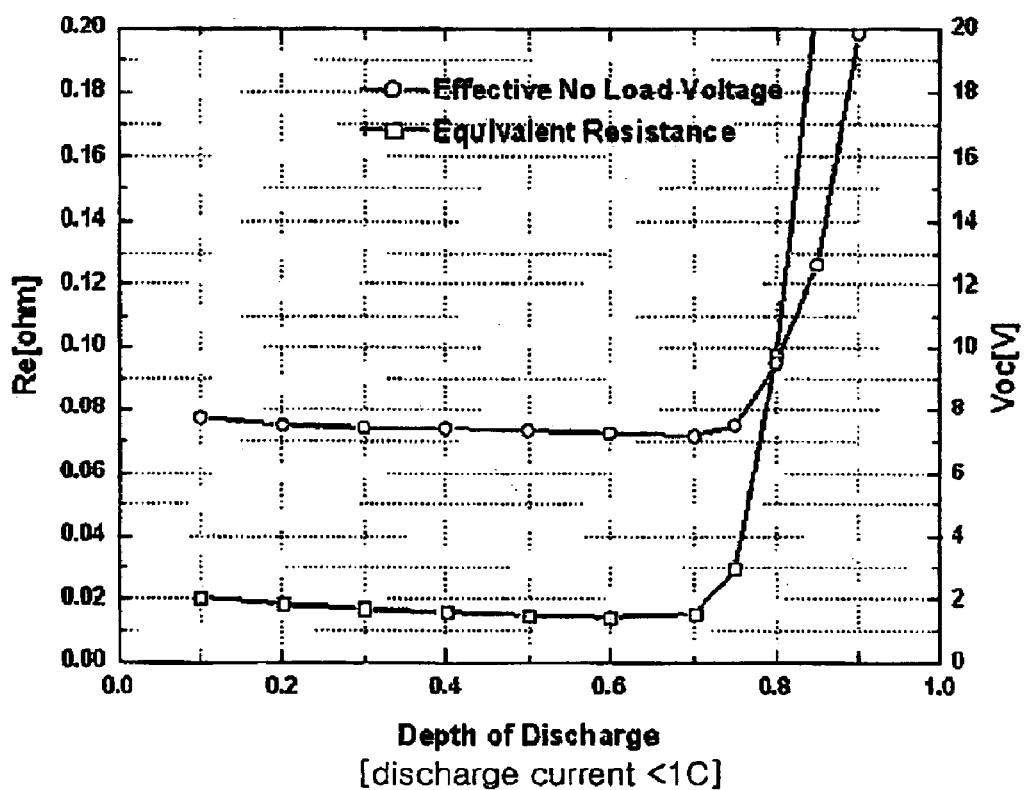
Figure 23:
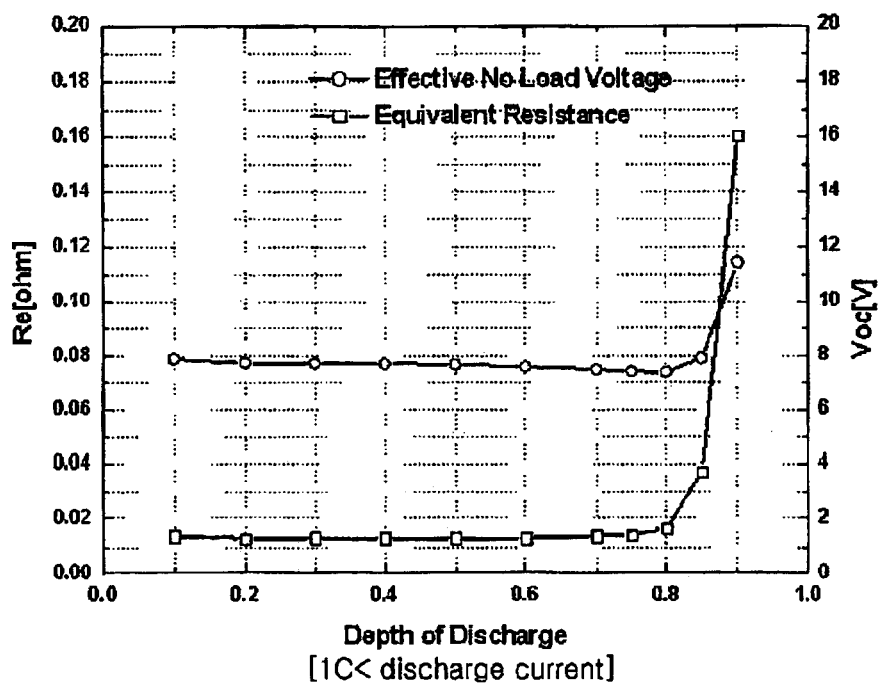

The equivalent discharge resistance data and the effective no load discharge voltage data for the predetermined battery temperature of 25° C. are shown in FIGS. 16 to 18, the equivalent discharge resistance data and the effective no load discharge voltage data for the predetermined battery temperature of 40° C. are shown in FIGS. 19 to 21, and the equivalent discharge resistance data and the effective no load discharge voltage data for the predetermined battery temperature of 0° C. are shown in FIGS. 22 and 23.

As shown in FIGS. 16 to 23, the equivalent discharge resistance and the effective no load discharge voltage change according to the battery temperature, the DOD, and the discharge current.

As shown in the drawings, the equivalent discharge resistance generally increases with an increase of the DOD. The effective no load discharge voltage is calculated by the above-stated equation 7.

Figure 6:
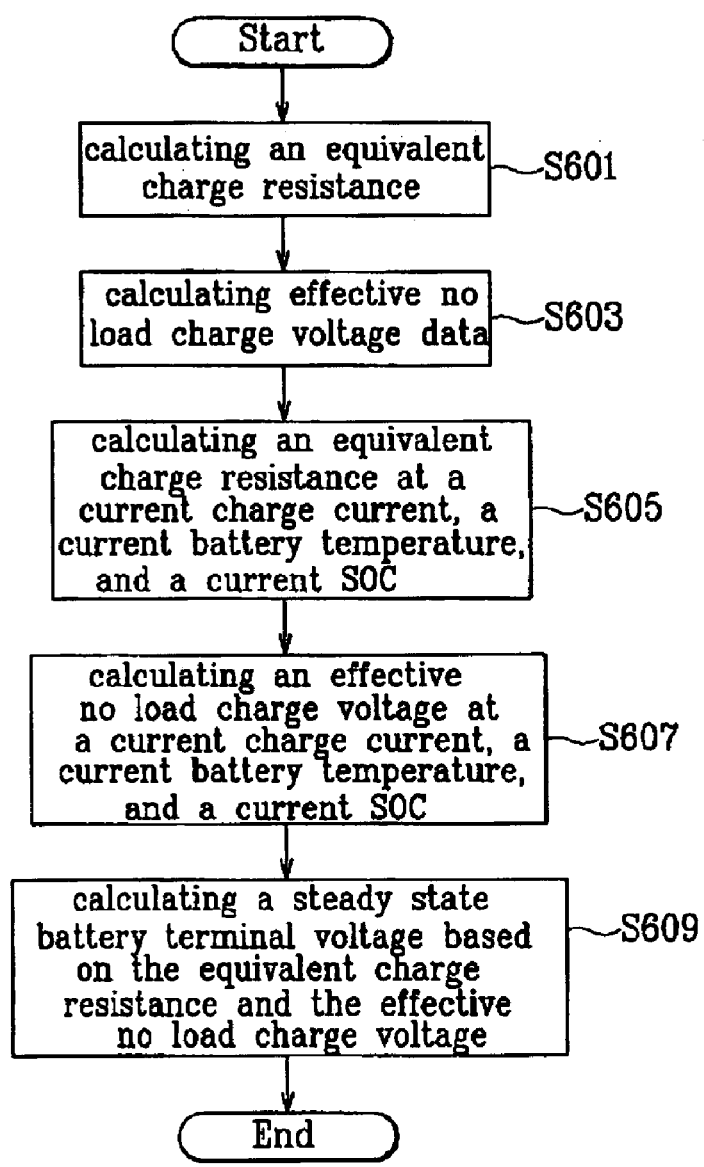
FIG. 6 is a flowchart of a method for determining a steady state battery terminal voltage while a battery is being charged according to the embodiment of the present invention.

Referring to FIG. 6, the method for calculating the steady state battery terminal voltage while the battery is being charged will be explained.

At first, in steps S601 and S603, the equivalent charge resistance data and the effective no load charge voltage data are calculated.

The calculations of the equivalent charge resistance and the effective no load charge voltage data are already explained referring to FIG. 4.

Then, in step S605, an equivalent charge resistance at current conditions (e.g., at a current charge current, a current battery temperature, and a current SOC) is calculated based on the determined equivalent charge resistance data.

At this time, the equivalent charge resistance is calculated based on the equivalent charge resistance data of the specific charge current range to which the current charge current belongs.

Then, using the corresponding equivalent charge resistance data, the equivalent charge resistance is calculated. At this time, the equivalent charge resistance at the current conditions can be calculated through an interpolation method with respect to the SOC and the battery temperature.

For example, if a current charge current is 3C, a current SOC is 0.45 (e.g., 45%), and a current battery temperature is 30° C., an equivalent charge resistance is determined using the equivalent charge resistance data shown in FIGS. 9 and 12. By performing interpolation with respect to the SOC using equivalent charge resistances corresponding to SOC 0.4 and SOC 0.5, an equivalent charge resistance corresponding to a case where the battery temperature is 25° C. and the SOC is 0.45 can be found. Similarly, by performing interpolation with respect to the SOC using equivalent charge resistances corresponding to SOC 0.4 and SOC 0.5, an equivalent charge resistance corresponding to a case where the battery temperature is 40° C. and the SOC is 0.45 can be found. Then, by performing interpolation with respect to the battery temperature using the two equivalent charge resistances, an equivalent charge resistance corresponding to a case where the battery temperature is 30° C. and the SOC is 0.45 can be found.

In step S607, an effective no load charge voltage at current conditions (e.g., at a current charge current, a current battery temperature, and a current SOC) is calculated based on the determined effective no load charge voltage data.

The effective no load charge voltage can be determined in a similar way with the equivalent charge resistance. That is, the effective no load charge voltage is calculated using the effective no load charge voltage data of a specific charge current range to which the current charge current belongs.

Then, using the corresponding effective no load charge voltage data, the effective no load charge voltage is calculated. At this time, the effective no load charge voltage at the current conditions can be calculated through an interpolation method with respect to the SOC and the battery temperature.

Then, in step S609, the steady state battery terminal voltage is calculated based on the determined equivalent charge resistance and the determined effective no load charge voltage.

At this time, by inserting the equivalent charge resistance $R_{cha\_e}$, the effective no load charge voltage $V_{cha\_oc}$, and the current charge current $I_{cha\_t}$ into the equation 3, the steady state battery terminal voltage can be calculated.

Figure 7:
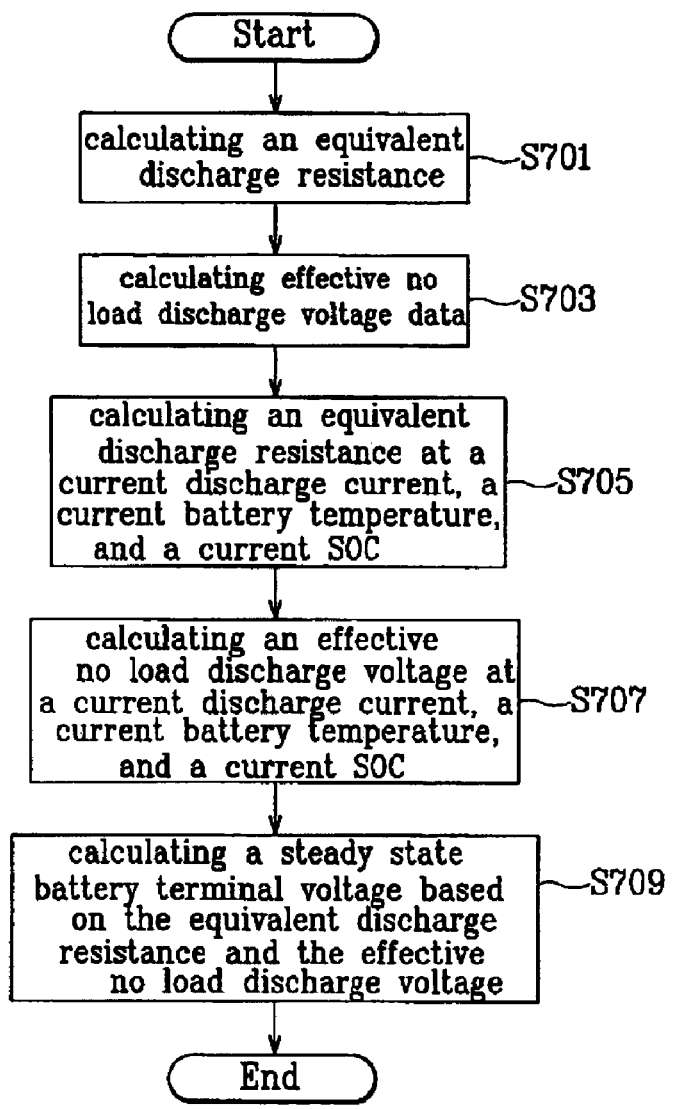
FIG. 7 is a flowchart of a method for determining a steady state battery terminal voltage while a battery is being discharged according to the embodiment of the present invention.

Referring to FIG. 7, the method for calculating the steady state battery terminal voltage while the battery is being discharged will be explained.

At first, in step S701 and S703, the equivalent discharge resistance data and the effective no load discharge voltage data are calculated. The calculations of the equivalent discharge resistance and the effective no load discharge voltage data are already explained in reference to FIG. 5.

Then, in step S705, an equivalent discharge resistance at current conditions (e.g., at a current discharge current, a current battery temperature, and a current DOD) is calculated based on the determined equivalent discharge resistance data. At this time, the equivalent discharge resistance is calculated based on the equivalent discharge resistance data of the specific discharge current range to which the current discharge current belongs.

Then, using the corresponding equivalent discharge resistance data, the equivalent discharge resistance is calculated. At this time, the equivalent discharge resistance at the current conditions can be calculated through an interpolation method with respect to the DOD and the battery temperature.

Because the calculation of the equivalent discharge resistance through the interpolation method can be performed similarly with the calculation of the equivalent charge resistance using the interpolation method, further explanations will be omitted.

In step S707, an effective no load discharge voltage at current conditions (e.g., at a current discharge current, a current battery temperature, and a current DOD) is calculated based on the determined effective no load discharge voltage data.

The effective no load discharge voltage can be determined in a similar way with the equivalent discharge resistance. That is, the effective no load discharge voltage is calculated using the effective no load discharge voltage data of a specific discharge charge current range to which the current discharge charge current belongs.

Then, using the corresponding effective no load discharge voltage data, the effective no load discharge voltage is calculated. At this time, the effective no load discharge voltage at the current conditions can be calculated through an interpolation method with respect to the DOD and the battery temperature.

Then, in step S709, the steady state battery terminal voltage is calculated based on the determined equivalent discharge resistance and the determined effective no load discharge voltage.

At this time, by inserting the equivalent discharge resistance $R_{dch\_e}$, the effective no load discharge voltage $V_{dch\_oc}$, and the current discharge current $I_{dch\_t}$ into the equation 3, the steady state battery terminal voltage can be calculated.

FIGS. 24 to 31 show the steady state battery terminal voltage determined by the embodiment of the present invention.

Figure 24:
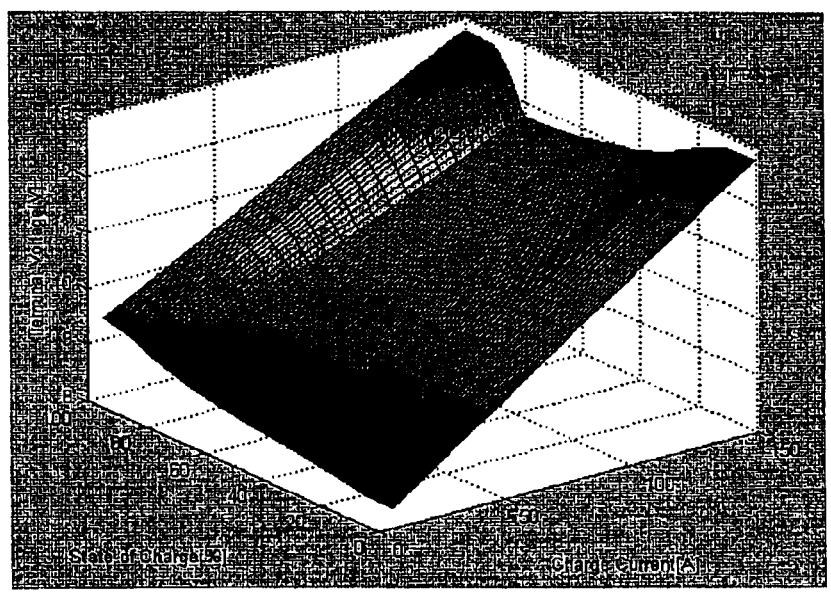
FIGS. 24 to 26 are three-dimensional graphs showing steady state battery terminal voltages while a battery is being charged.
Figure 25:
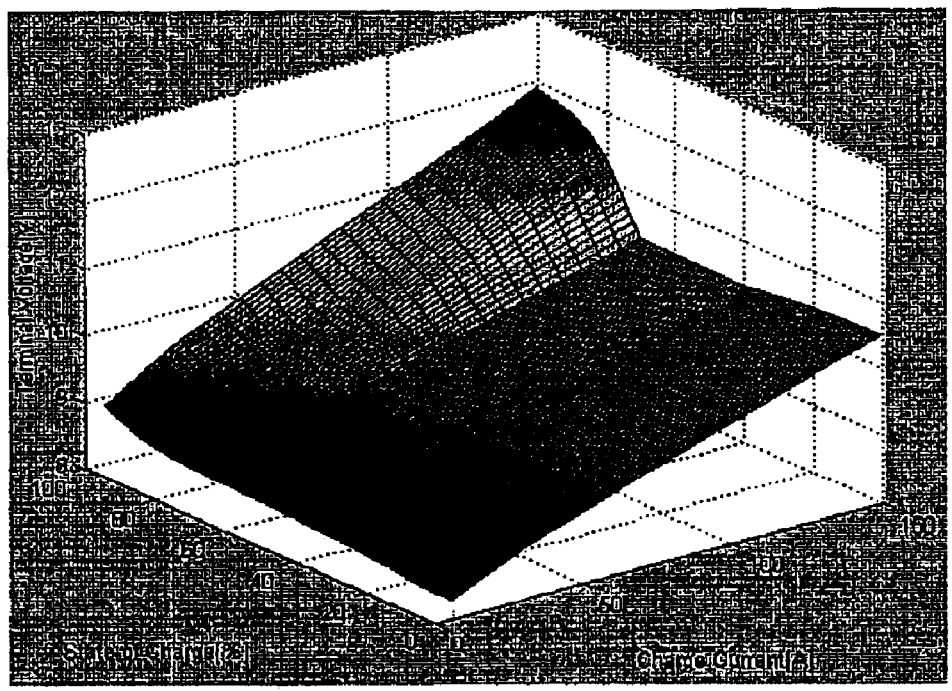
Figure 26:
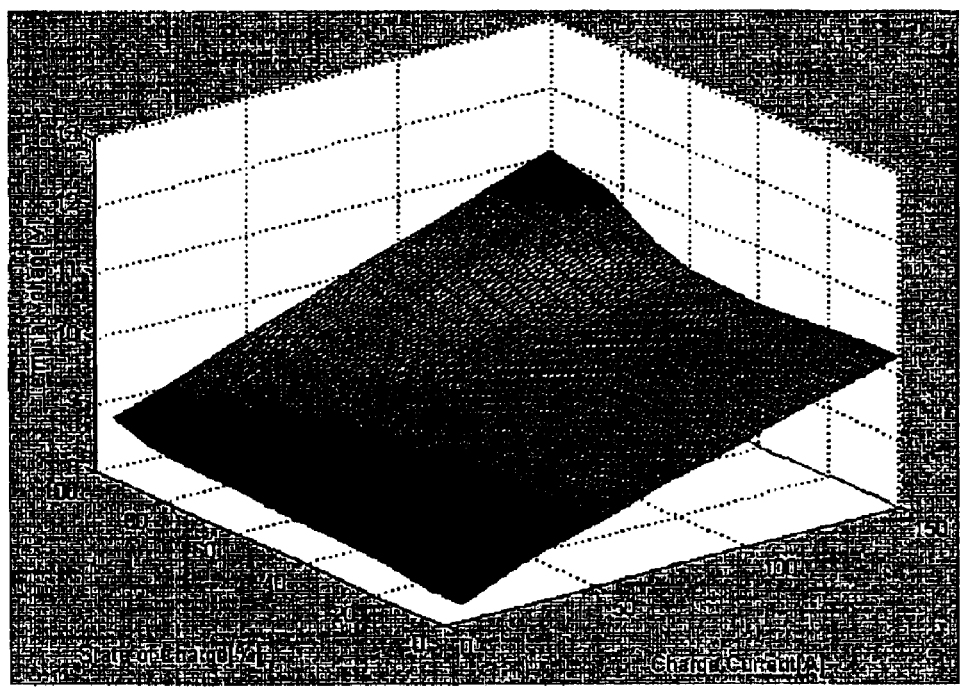

FIGS. 24 to 26 show the steady state battery terminal voltage during the charge of the battery. FIG. 24 is for the case in which the battery temperature is 0° C., FIG. 25 is for the case in which the battery temperature is 25° C., and FIG. 26 is for the case in which the battery temperature is 40° C.

As shown in FIGS. 24 to 26, the battery terminal voltage increases as the SOC increases, and it decreases as the battery temperature increases.

Figure 27:
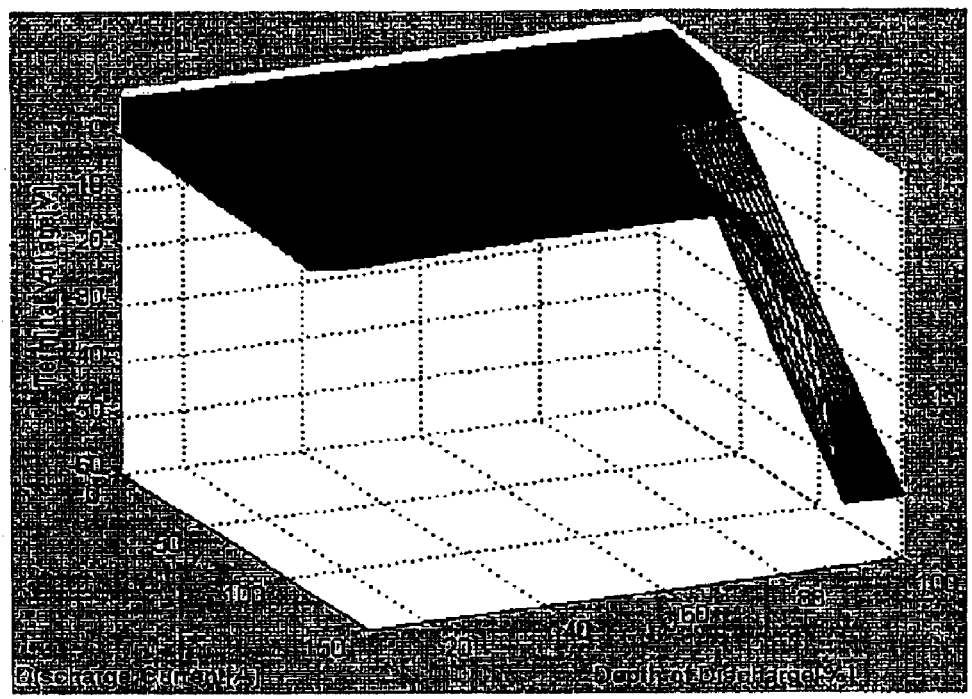
FIGS. 27 to 29 are three-dimensional graphs showing steady state battery terminal voltages while a battery is being discharged.
Figure 28:
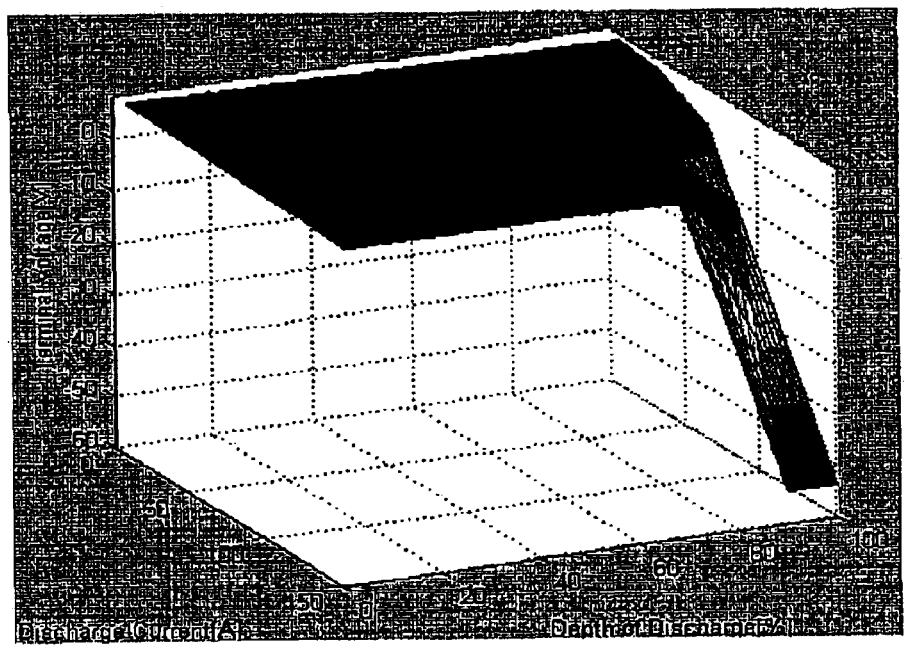
Figure 29:
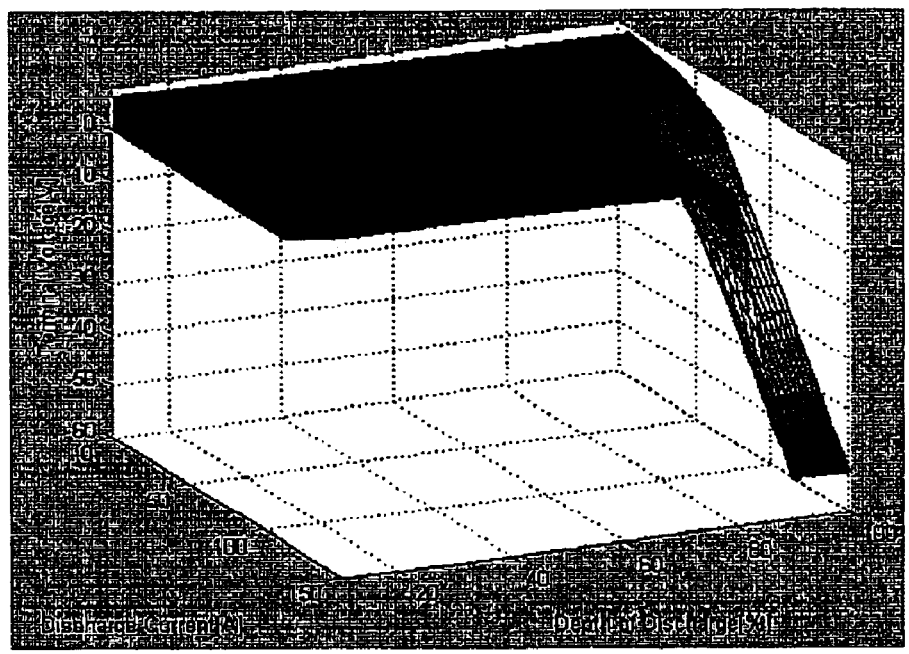

FIGS. 27 to 29 show the steady state battery terminal voltage during the discharge of the battery. FIG. 27 is for the case in which the battery temperature is 0° C., FIG. 28 is for the case in which the battery temperature is 25° C., and the FIG. 29 is for the case in which the battery temperature is 40° C.

As shown in FIGS. 27 to 29, the battery terminal voltage decreases as the battery temperature decreases and the DOD increases.

Figure 30:
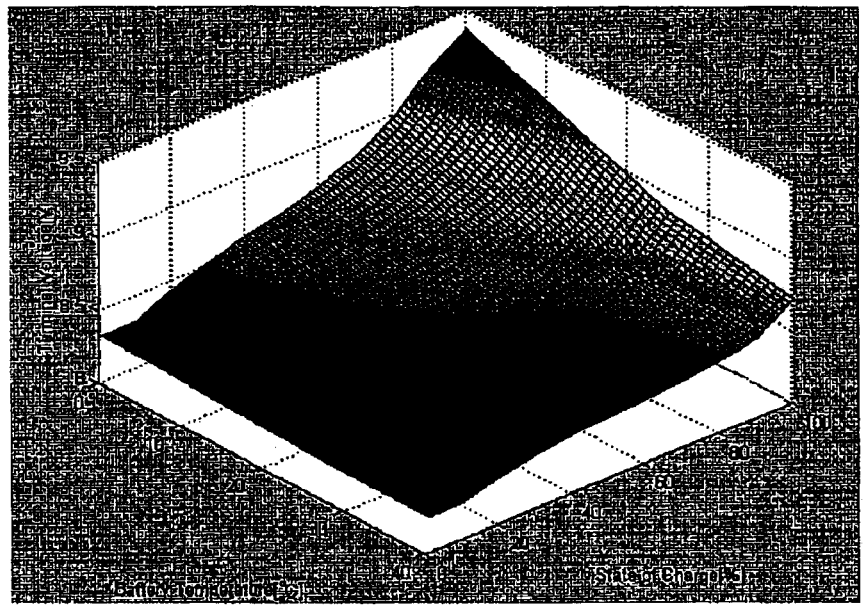
FIG. 30 is a three-dimensional graph showing steady state battery terminal voltages with respect to changes of a battery temperature while a battery is being charged.
Figure 31:
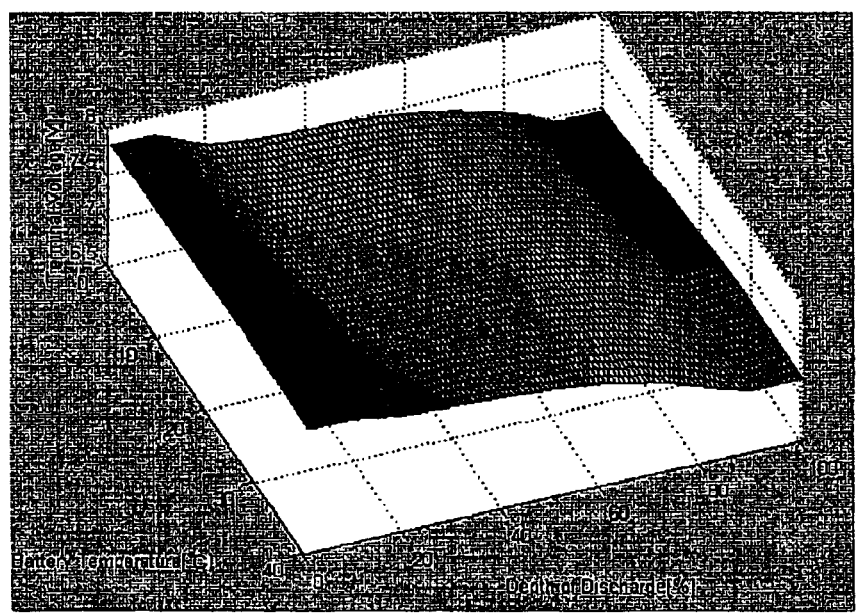
FIG. 31 is a three-dimensional graph showing steady state battery terminal voltages with respect to changes of a battery temperature while a battery is being discharged.

FIGS. 30 and 31 show changes of the battery terminal voltage according to a change of the battery temperature when the battery is charged or discharged at 1C.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

According to the embodiment of the present invention, the steady state battery terminal voltage at a current charge (or discharge) current, a current battery temperature, and a state of charge (or depth of discharge) can be determined using terminal voltages that are obtained while the battery is being charged (or discharged) by a constant current.

What is claimed is:

1. A method for determining a steady state battery terminal voltage comprising:

determining an equivalent charge resistance data at predetermined battery temperatures and predetermined states of charge (SOCs) for predetermined charge current ranges;

determining effective no load charge voltage data at the predetermined battery temperatures and the predetermined SOCs for the predetermined charge current ranges based on the equivalent charge resistance data;

calculating an equivalent charge resistance at a current charge current, a current battery temperature, and a current SOC, based on the equivalent charge resistance data;

calculating an effective no load charge voltage at the current charge current, the current battery temperature, and the current SOC, based on the effective no load charge voltage data; and calculating the steady state battery terminal voltage at the current charge current, the current battery temperature, and the current SOC, based on the calculated equivalent charge resistance and the calculated effective no load charge voltage.

2. The method of claim 1, wherein the determining an equivalent charge resistance data comprises:

detecting first battery terminal voltages at each of the predetermined SOCs, while charging a battery at each of the predetermined battery temperatures with first constant charge currents belonging to each of the predetermined charge current ranges;

detecting second battery terminal voltages at each of the predetermined SOCs while charging the battery at each of the predetermined battery temperatures with second constant charge currents belonging to each of the predetermined charge current ranges; and determining the equivalent charge resistance data at the predetermined battery temperatures and the predetermined SOCs for each of the predetermined charge current ranges, based on the first constant charge currents, the first battery terminal voltages, the second constant charge currents, and the second battery terminal voltages.

3. The method of claim 2, wherein the equivalent charge resistance data $R_{cha\_e\_data}$ is calculated by the following equation:

$$R_{cha\_e\_data} = \left(\frac{V_2 - V_1}{I_2 - I_1}\right)@SOC,$$

where $I_1$ is the first constant charge current, $I_2$ is the second constant charge current, $V_1$ is the first battery terminal voltage, and $V_2$ is the second battery terminal voltage.

4. The method of claim 3, wherein the effective no load charge voltage data $V_{cha\_oc\_data}$ is calculated by one of the following equations:

$$V_{\text{cha\_oc\_data}} = V_2 + I_2 \times R_{\text{cha\_e\_data}} @ SOC;$$

and $$V_{\text{cha\_oc\_data}} = V_1 + I_1 \times R_{\text{cha\_e\_data}} @ SOC.$$

5. The method of claim 1, wherein in the calculating an equivalent charge resistance, the equivalent charge resistance at the current charge current, the current battery temperature, and the current SOC is calculated based on the equivalent charge resistance data for the predetermined charge current range to which the current charge current belongs.

6. The method of claim 5, wherein in the calculating an equivalent charge resistance, the equivalent charge resistance is calculated through interpolation.

7. The method of claim 1, wherein in the calculating an effective no load charge voltage, the effective no load charge voltage at the current charge current, the current battery temperature, and the current SOC are calculated based on the effective no load charge voltage data for the predetermined charge current range to which the current charge current belongs.

8. The method of claim 7, wherein in the calculating an effective no load charge voltage, the effective no load charge voltage is calculated through interpolation.

9. The method of claim 1, wherein in the calculating a steady state battery terminal voltage $V_{cha\_t}$, the steady state battery terminal voltage at the current charge current, the battery temperature, and the current SOC is calculated by the following equation:

$$V_{cha\_t} = V_{cha\_oc} - I_{cha\_t} \times R_{cha\_e}$$

where $V_{cha\_oc}$ is the effective no load charge voltage, $I_{cha\_t}$ is the current charge current, and $R_{cha\_e}$ is the equivalent charge resistance.

10. The method of claim 1, wherein the predetermined charge current ranges include a range where a charge current is less than 1C, a range where the charge current is between 1C and 5C, and a range where the charge current is greater than 5C.

11. A method for determining a steady state battery terminal voltage, comprising:
  calculating an equivalent charge resistance at a current charge current, a current battery temperature, and a current state of charge (SOC), based on predetermined equivalent charge resistance data that is determined at predetermined battery temperatures and predetermined SOCs for predetermined charge current ranges;
  calculating an effective no load charge voltage at the current charge current, the current battery temperature, and the current SOC, based on predetermined effective no load charge voltage data that is determined at the predetermined battery temperatures and the predetermined SOCs for the predetermined charge current ranges; and
  calculating the steady state battery terminal voltage at the current charge current, the current battery temperature, and the current SOC, based on the calculated equivalent charge resistance and the calculated effective no load charge voltage.

12. The method of claim 11, wherein in the calculating an equivalent charge resistance, the equivalent charge resistance is calculated based on the current battery temperature, the current SOC, and the equivalent charge resistance data for the predetermined current range to which the current charge current belongs.

13. The method of claim 12, wherein the equivalent charge resistance is calculated through interpolation.

14. The method of claim 11, wherein in the calculating an effective no load charge voltage, the effective no load charge voltage is calculated based on the current battery temperature, the current SOC, and the equivalent no load charge voltage data for the predetermined charge current range to which the current charge current belongs.

15. The method of claim 14, wherein the effective no load charge voltage is calculated through interpolation.

16. The method of claim 11, wherein in the calculating a steady state battery terminal voltage, the steady state battery terminal voltage is calculated by the following equation:

$$V_{cha\_t} = V_{cha\_oc} - I_{cha\_t} \times R_{cha\_e}$$

where $V_{cha\_oc}$ is the effective no load charge voltage, $I_{cha\_t}$ is the current charge current, and $R_{cha\_e}$ is the equivalent charge resistance.

17. A method for determining a steady state battery terminal voltage, comprising:
  determining equivalent discharge resistance data at predetermined battery temperatures and predetermined depths of discharge (DODs) for predetermined discharge current ranges;
  determining effective no load discharge voltage data at the predetermined battery temperatures and the predetermined DODs for the predetermined discharge current ranges on the basis of the equivalent discharge resistance data;
  calculating an equivalent discharge resistance at a current discharge current, a current battery temperature, and a current DOD, based on the equivalent discharge resistance data;
  calculating an effective no load discharge voltage at the current discharge current, the current battery temperature, and the current DOD, based on the effective no load discharge voltage data; and
  calculating the steady state battery terminal voltage at the current discharge current, the current battery temperature, and the current DOD, based on the calculated equivalent discharge resistance and the calculated effective no load discharge voltage.

18. The method of claim 17, wherein the determining an equivalent discharge resistance data comprises:
  detecting first battery terminal voltages at each of the predetermined DODs while discharging a battery at each of the predetermined battery temperatures with first constant discharge currents belonging to each of the predetermined discharge current ranges;
  detecting second battery terminal voltages at each of the predetermined DODs while discharging the battery at each of the predetermined battery temperatures with second constant discharge currents belonging to each of the predetermined discharge current ranges; and
  determining the equivalent discharge resistance data at the predetermined battery temperatures and the predetermined DODs for each of the predetermined discharge current ranges, based on the first constant discharge currents, the first battery terminal voltages, the second constant discharge currents, and the second battery terminal voltages.

19. The method of claim 18, wherein the equivalent discharge resistance data $R_{dch\_e\_data}$ is calculated by the following equation:

$$R_{dch\_e\_data} = \left(\frac{V_2 - V_1}{I_2 - I_1}\right) @ DOD,$$

where $I_1$ is the first constant discharge current, $I_2$ is the second constant discharge current, $V_1$ is the first battery terminal voltage, and $V_2$ is the second battery terminal voltage.

20. The method of claim 19, wherein the effective no load discharge voltage data $V_{dch\_oc\_data}$ is calculated by one of the following equations:

$$V_{dch\_oc\_data} = V_2 + I_2 \times R_{dch\_e\_data} @ DOD;$$

and $$V_{dch\_oc\_data} = V_1 + I_1 \times R_{dch\_e\_data} @ DOD.$$

21. The method of claim 17, wherein in the calculating an equivalent discharge resistance, the equivalent discharge resistance at the current discharge current, the current battery temperature, and the current DOD are calculated based on the equivalent discharge resistance data for the predetermined discharge current range to which the current discharge current belongs.

22. The method of claim 21, wherein in the calculating an equivalent discharge resistance, the equivalent discharge resistance is calculated through interpolation.

23. The method of claim 17, wherein in the calculating an effective no load discharge voltage, the effective no load discharge voltage at the current discharge current, the current battery temperature, and the current DOD are calculated based on the effective no load discharge voltage data for the predetermined discharge current range to which the current discharge current belongs.

24. The method of claim 23, wherein in the calculating an effective no load discharge voltage, the effective no load discharge voltage is calculated through interpolation.

25. The method of claim 17, wherein in the calculating a steady state battery terminal voltage $V_{dch\_t}$, the steady state battery terminal voltage at the current discharge current, the battery temperature, and the current DOD is calculated by the following equation:

$$V_{dch\_t} = V_{dch\_oc} - I_{dch\_t} \times R_{dch\_e}$$

where $V_{dch\_oc}$ is the effective no load discharge voltage, $I_{dch\_t}$ is the current discharge current, and $R_{dch\_e}$ is the equivalent discharge resistance.

26. The method of claim 17, wherein the predetermined discharge current ranges include a range where a discharge current is less than 1C, a range where the discharge current is between 1C and 5C, and a range where the discharge current is greater than 5C.

27. A method for determining a steady state battery terminal voltage comprising:

calculating an equivalent discharge resistance at a current discharge current, a current battery temperature, and a current depth of discharge (DOD), based on predetermined equivalent discharge resistance data that are determined at predetermined battery temperatures and predetermined DODs for predetermined discharge current ranges;

calculating an effective no load discharge voltage at the current discharge current, the current battery temperature, and the current DOD, based on predetermined effective no load discharge voltage data that are determined at the predetermined battery temperatures and the predetermined DODs for the predetermined discharge current ranges; and calculating the steady state battery terminal voltage at the current discharge current, the current battery temperature, and the current DOD, based on the calculated equivalent discharge resistance and the calculated effective no load discharge voltage.

28. The method of claim 27, wherein in the calculating an equivalent discharge resistance, the equivalent discharge resistance is calculated based on the current battery temperature, the current DOD, and the equivalent discharge resistance data for the predetermined current range to which the current discharge current belongs.

29. The method of claim 28, wherein the equivalent discharge resistance is calculated through interpolation.

30. The method of claim 27, wherein in the calculating an effective no load discharge voltage, the effective no load discharge voltage is calculated based on the current battery temperature, the current DOD, and the equivalent no load discharge voltage data for the predetermined discharge current range to which the current discharge current belongs.

31. The method of claim 30, wherein the effective no load discharge voltage is calculated through interpolation.

32. The method of claim 31, wherein in the calculating a steady state battery terminal voltage, the steady state battery terminal voltage is calculated by the following equation:

$$V_{dch\_t} = V_{dch\_oc} - I_{dch\_t} \times R_{dch\_e}$$

where $V_{dch\_oc}$ is the effective no load discharge voltage, $I_{dch\_t}$ is the current discharge current, and $R_{dch\_e}$ is the equivalent discharge resistance.

* * * * *